(12) United States Patent
Kremerman et al.

(10) Patent No.: US 8,784,033 B2
(45) Date of Patent: Jul. 22, 2014

(54) ROBOT SYSTEMS, APPARATUS AND METHODS FOR TRANSPORTING SUBSTRATES

(75) Inventors: Izya Kremerman, Los Gatos, CA (US); Jeffrey C. Hudgens, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 815 days.

(21) Appl. No.: 12/684,780

(22) Filed: Jan. 8, 2010

(65) Prior Publication Data

US 2010/0178147 A1 Jul. 15, 2010

Related U.S. Application Data

(60) Provisional application No. 61/143,804, filed on Jan. 11, 2009.

(51) Int. Cl.
| | | |
|---|---|---|
| B66C 23/00 | (2006.01) | |
| B25J 9/06 | (2006.01) | |
| H01L 21/677 | (2006.01) | |
| H01L 21/683 | (2006.01) | |
| B25J 9/04 | (2006.01) | |
| B25J 9/10 | (2006.01) | |

(52) U.S. Cl.
CPC *B25J 9/043* (2013.01); *B25J 9/107* (2013.01); *H01L 21/67742* (2013.01); *Y10S 414/139* (2013.01); *Y10S 901/15* (2013.01)
USPC .................. 414/744.5; 74/490.01; 414/939; 901/15

(58) Field of Classification Search
CPC ..... B25J 9/043; B25J 9/107; H01L 21/67742; Y10S 414/139; Y10S 901/15
USPC .................. 414/744.5; 901/15; 74/490.01
See application file for complete search history.

(56) References Cited

U.S. PATENT DOCUMENTS

| | | | | |
|---|---|---|---|---|
| 4,597,708 | A | | 7/1986 | Wheeler et al. |
| 5,584,647 | A | * | 12/1996 | Uehara et al. ............ 414/744.5 |
| 5,765,444 | A | * | 6/1998 | Bacchi et al. ............ 74/490.03 |
| 5,954,472 | A | * | 9/1999 | Hofmeister et al. ....... 414/744.5 |
| 6,105,454 | A | * | 8/2000 | Bacchi et al. ............ 74/490.03 |
| 6,669,434 | B2 | * | 12/2003 | Namba et al. ............ 414/744.5 |
| 6,826,977 | B2 | * | 12/2004 | Grover et al. ............ 74/490.03 |

(Continued)

FOREIGN PATENT DOCUMENTS

| | | |
|---|---|---|
| JP | H07-142551 | 6/1995 |
| JP | H10-247674 | 9/1998 |

(Continued)

OTHER PUBLICATIONS

William P. Laceky et al., U.S. Appl. No. 12/684,772, filed Jan. 8, 2010.

(Continued)

*Primary Examiner* — Scott Lowe
(74) *Attorney, Agent, or Firm* — Dugan & Dugan, PC

(57) ABSTRACT

Substrate transport systems, apparatus and methods are described. The systems are adapted to efficiently put or pick substrates at a destination by rotating a boom linkage to a position adjacent to the destination and then actuating a robot assembly to put or pick the substrate at the destination. Numerous other aspects are provided.

11 Claims, 22 Drawing Sheets

(56) References Cited

U.S. PATENT DOCUMENTS

| | | | |
|---|---|---|---|
| 7,955,043 B2 * | 6/2011 | Nakao | 414/744.5 |
| 8,136,422 B2 * | 3/2012 | Kitahara et al. | 74/490.1 |
| 2001/0036398 A1 | 11/2001 | Hofmeister | |
| 2002/0094265 A1 * | 7/2002 | Momoki | 414/744.5 |
| 2002/0150459 A1 * | 10/2002 | Fujii et al. | 414/744.5 |
| 2005/0095111 A1 * | 5/2005 | Kim et al. | 414/744.5 |
| 2006/0099063 A1 * | 5/2006 | Pietrantonio et al. | 414/744.5 |
| 2006/0216137 A1 * | 9/2006 | Sakata et al. | 414/222.13 |
| 2006/0245905 A1 | 11/2006 | Hudgens | |
| 2007/0116549 A1 | 5/2007 | Rice et al. | |
| 2007/0217896 A1 * | 9/2007 | Kim et al. | 414/217 |
| 2008/0063504 A1 | 3/2008 | Kroetz et al. | |
| 2008/0298945 A1 | 12/2008 | Cox et al. | |
| 2009/0087288 A1 * | 4/2009 | Hofmeister et al. | 414/222.02 |
| 2012/0141235 A1 | 6/2012 | Krupyshe et al. | |

FOREIGN PATENT DOCUMENTS

| | | | |
|---|---|---|---|
| JP | 11-016981 | 1/1999 | |
| JP | H11-277467 | 10/1999 | |
| JP | 2000-072248 | 3/2000 | |
| JP | 2002-158272 | 5/2002 | |
| JP | 2002-172571 | 6/2002 | |
| JP | 2005-186259 | 7/2005 | |
| JP | 2007-130733 | 5/2007 | |
| JP | 2008-235836 | 10/2008 | |
| JP | 2008-272864 | 11/2008 | |
| JP | 2009-540613 | 11/2009 | |
| WO | WO 2006/109791 | * 10/2006 | B65G 49/07 |

OTHER PUBLICATIONS

Izya Kremerman et al., U.S. Appl. No. 12/684,672, filed Jan. 8, 2010.
International Search Report and Written Opinion of International Application No. PCT/US2010/020477 mailed Jun. 28, 2010.
International Preliminary Report on Patentability of International Application No. PCT/US2010/020477 mailed Jul. 21, 2011.
Hudgens et al., U.S. Appl. No. 13/923,741, filed Jun. 21, 2013.
Chinese Search Report of Chinese Patent Application No. 201080008862.9 dated Mar. 11, 2013.
International Search Report and Written Opinion of International Application No. PCT/US13/47034 mailed Sep. 6, 2013.
Office Action of Japanese Application No. 2011-545450 dated Nov. 19, 2013.

* cited by examiner

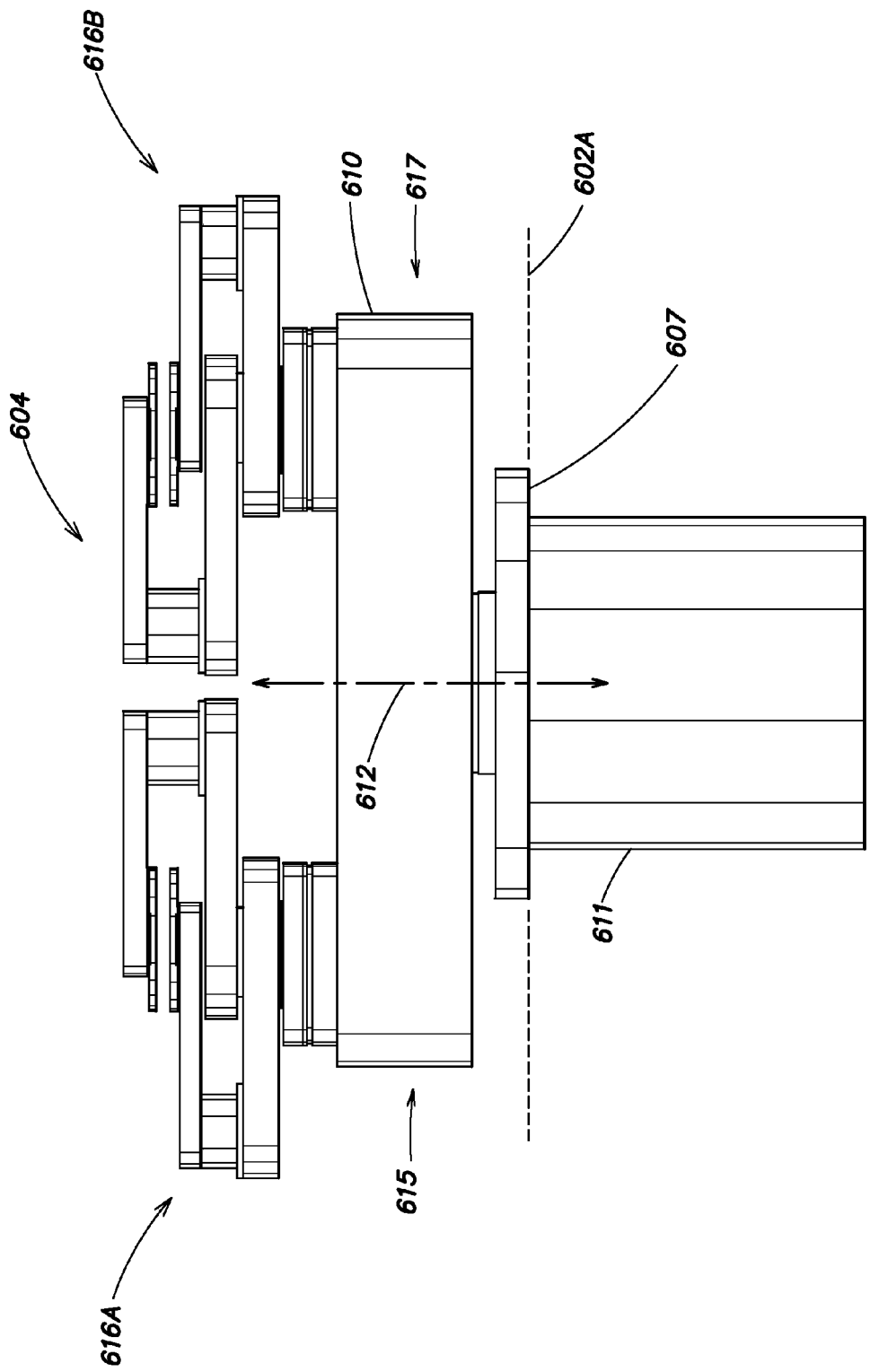

ROBOT SYSTEMS, APPARATUS AND METHODS FOR TRANSPORTING SUBSTRATES

The present application claims priority to U.S. Provisional Patent Application No. 61/143,804, filed Jan. 11, 2009, and entitled "ROBOTS SYSTEMS, APPARATUS AND METHODS FOR TRANSPORTING SUBSTRATES IN ELECTRONIC DEVICE MANUFACTURING", which is hereby incorporated herein by reference in its entirety for all purposes.

FIELD OF THE INVENTION

The present invention relates to electronic device manufacturing, and more specifically to systems, apparatus and methods for transporting substrates.

BACKGROUND OF THE INVENTION

Conventional electronic device manufacturing systems may include multiple process chambers and load lock chambers. Such chambers may be included in cluster tools where a plurality of chambers may be provided about a transfer chamber, for example. These systems and tools may employ robots, which may be housed in the transfer chamber for example, to transport substrates between the various chambers and load locks. For example, the robots may transport a substrate from chamber to chamber, from load lock to chamber, and from chamber to load lock. Efficient and precise transport of substrates between the various system chambers may be important to system throughput, thereby lowering overall operating costs.

Accordingly, systems, apparatus and methods for efficient and precise movement of substrates are desired.

SUMMARY OF THE INVENTION

In one aspect an electronic device processing system is provided. The system includes a chamber; a robot apparatus received in the chamber and adapted to transport a substrate, the robot apparatus having a boom linkage adapted to rotate about a rotational axis and a first robot assembly, the robot assembly further including an upper arm coupled to the boom linkage at a first radial position offset from a rotational axis of the boom linkage, a forearm coupled to, and adapted for rotation relative to, the upper arm, a wrist member coupled to, and adapted for rotation relative to, the forearm, and an end effector included on the wrist member, the end effector adapted to carry the substrate.

In one aspect a robot apparatus adapted to move substrates within an electronic device processing system is provided. The robot apparatus includes a boom linkage adapted to be rotated about a rotational axis; an upper arm mounted for rotation on the boom linkage at a position offset radially from the rotational axis; a forearm coupled to an outboard end of the upper arm; a wrist member coupled to an outboard end of the forearm; and an end effector included on the wrist member.

In another aspect, a method of transporting a substrate within an electronic device processing system is provided. The method comprises the steps of providing a robot assembly mounted on a boom linkage, the robot assembly including an upper arm, a forearm coupled to the upper arm, and a wrist member coupled to the forearm; rotating the boom linkage to a location adjacent to a delivery location; and actuating the robot assembly to perform at least one of a put of the substrate to the delivery location, and a pick of the substrate from the delivery location.

Numerous other aspects are provided in accordance with these and other aspects of the invention. Other features and aspects of the present invention will become more fully apparent from the following detailed description, the appended claims and the accompanying drawings.

BRIEF DESCRIPTION OF THE DRAWINGS

FIG. 6B is a schematic side view of an embodiment of a robot apparatus of FIG. 6A according to the present invention.

DETAILED DESCRIPTION

Electronic device manufacturing may require very precise and rapid transport of substrates between various locations. In particular, end effector apparatus may be attached at an end of an arm of a robot apparatus and be adapted to transport substrates resting upon the end effector to and from chambers of a substrate processing system. When the arms are long, rigidity of the robot mechanism may be a concern in that rapid starts and stops of the robot apparatus may cause vibration of the end effector. Accordingly, placement of the substrate may require waiting until the vibrations settle. In other words, settling time of the robot arms may be a concern.

One robot apparatus which may be used for transporting substrates between chambers in electronic device manufacturing according to an aspect of the invention includes boom linkage, which is adapted to be rotated to a location adjacent to a destination where a substrate is to be put or picked from the destination. A multi-arm robot including an upper arm, forearm, and wrist member having an end effector may be affixed to the boom linkage at a location spaced from a rotational axis of the boom linkage. The multi-arm robot is then actuated to accomplish the put or pick of the substrate to or from the destination. Thereafter, the boom may be rotated to a second destination where another put or pick may be carried out by the multi-arm robot. Accordingly, because the boom linkage may allow the robot assembly to be placed initially closer to the destination, the overall size of the arms of the multi-arm robot assembly may be made smaller thereby possibly reducing settling time.

Further details of exemplary embodiments of the invention are described with reference to FIGS. 1-14.

Figure 1:
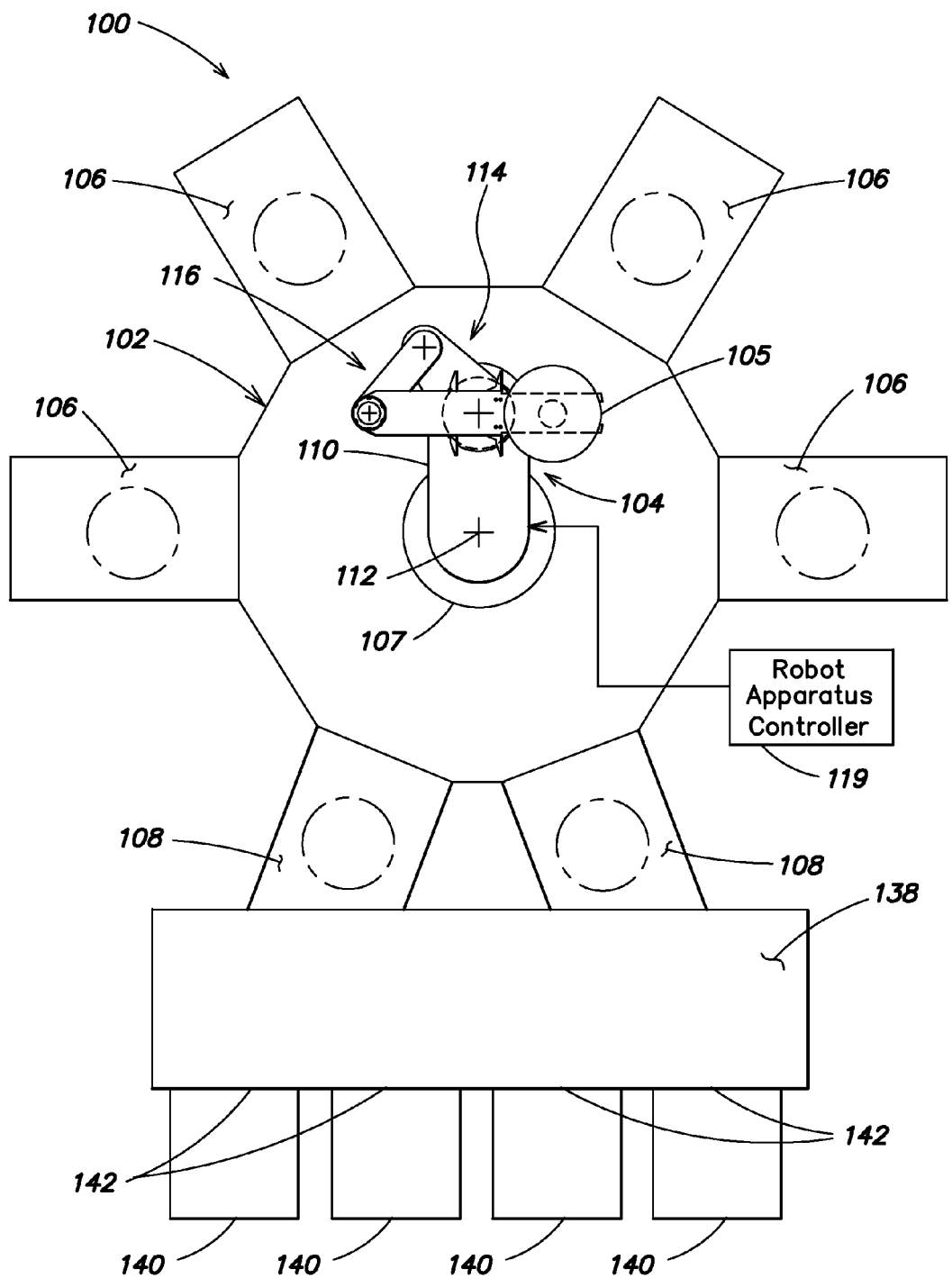
FIG. 1 is a schematic top view of a substrate processing system including a robot apparatus adapted to transport substrates according to the present invention.

FIG. 1 is a schematic diagram of an exemplary embodiment of a substrate processing system 100 according to the present invention. The substrate processing system 100 may include a transfer chamber 102 within which a robot apparatus 104 in accordance with another aspect of the invention may be housed. The robot apparatus 104 may be adapted to put or pick a substrate 105 to or from a destination. The destination may be a chamber coupled to the transfer chamber 102. For example, the destination may be one or more process chambers 106 and/or one or more load lock chambers 108 which may be coupled to the transfer chamber 102. Process chambers 106 may be adapted to carry out any number of process steps, such as deposition, oxidation, nitration, etching, polishing, cleaning, lithography, or the like. The load lock chambers 108 may be adapted to interface with a factory interface 138, which may receive substrates from substrate carriers 140 docked in load ports 142. In some embodiments, the transfer chamber 102 may be operated under a vacuum, for example.

Figure 2A:
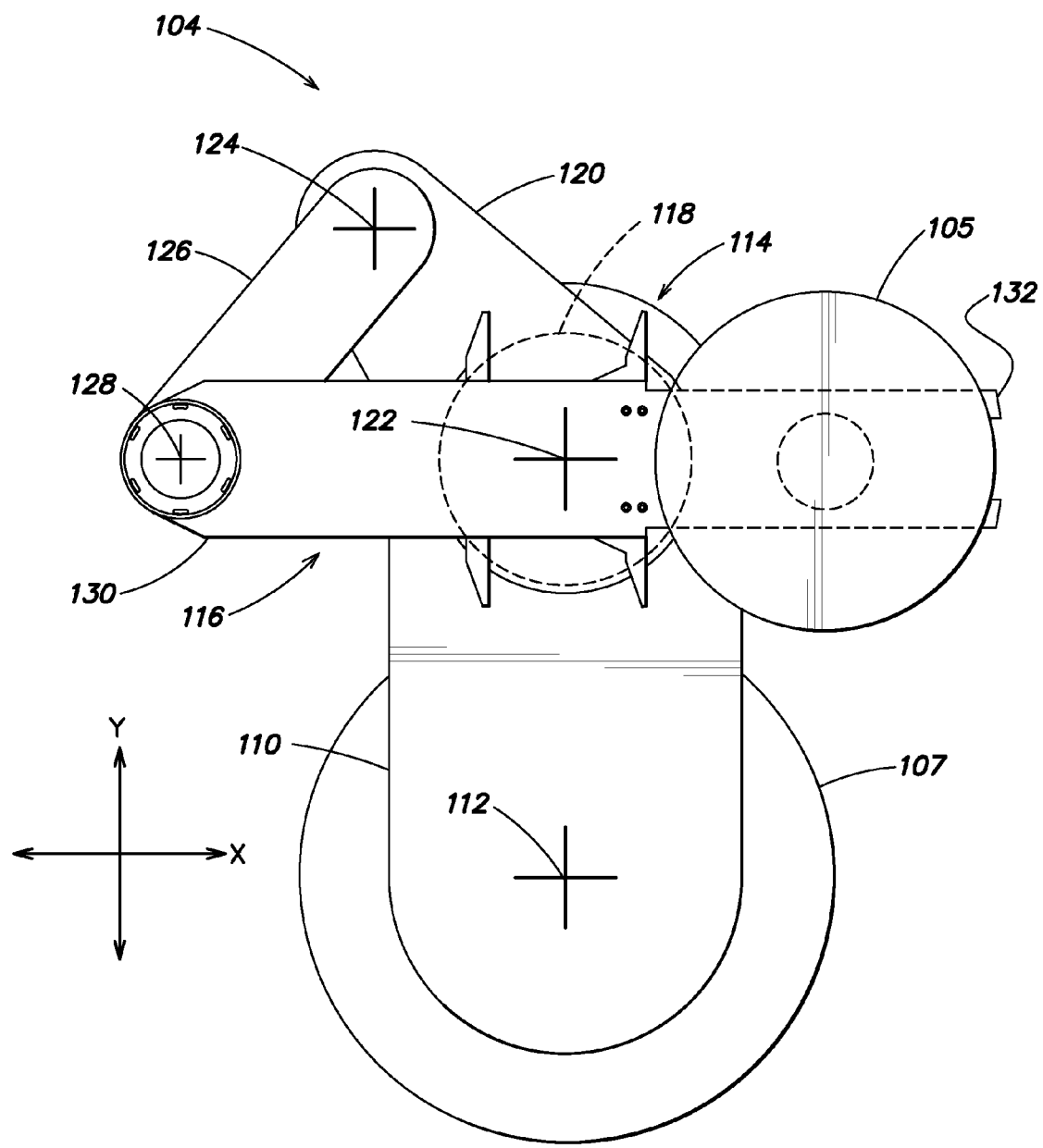
FIG. 2A is a schematic top view of an embodiment of a robot apparatus according to the present invention.
Figure 2B:
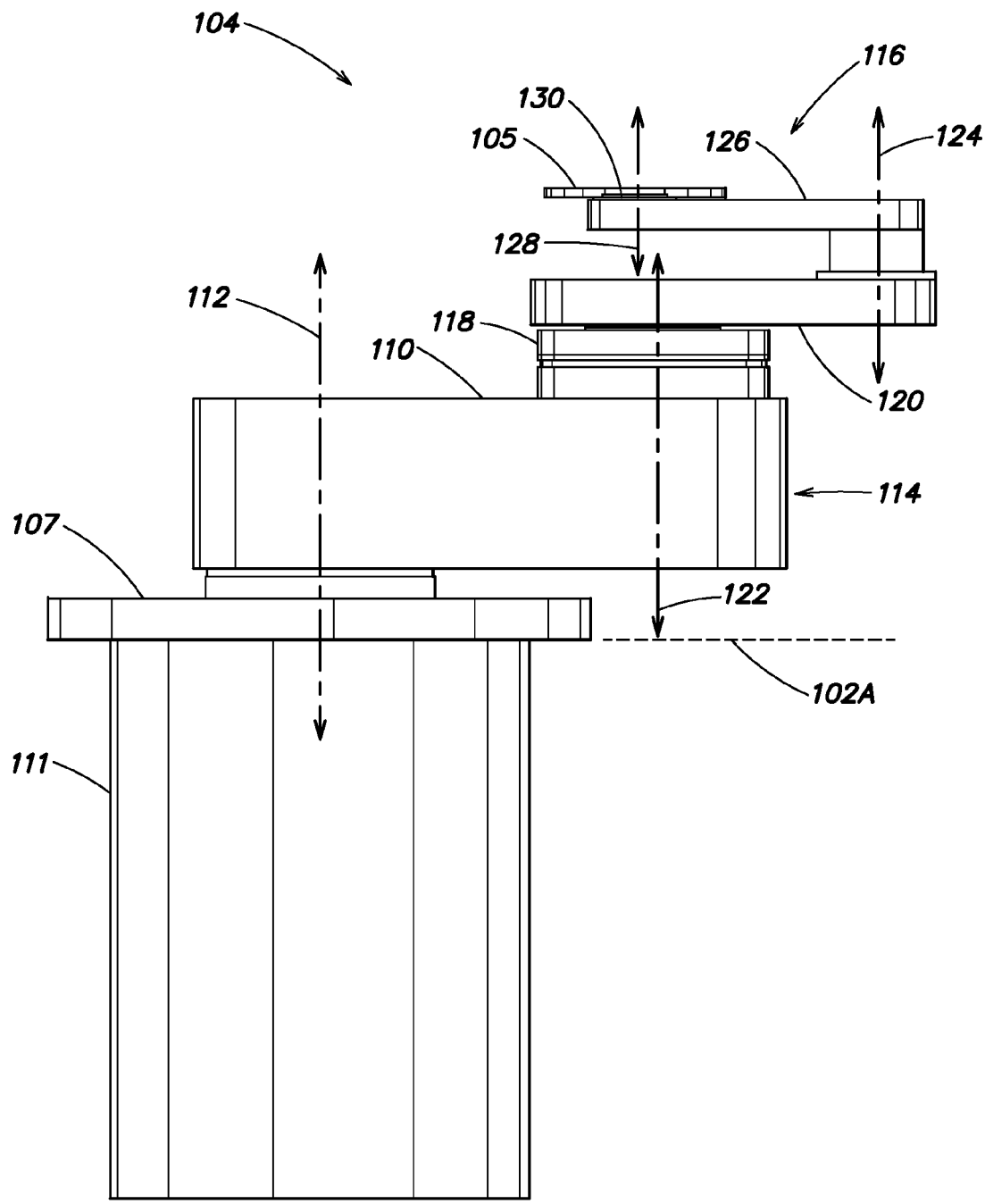
FIG. 2B is a schematic side view of an embodiment of a robot apparatus of FIG. 2A according to the present invention.

Now referring to FIG. 1 and FIGS. 2A-2C, the robot apparatus 104 may include a base 107 adapted to be attached to a wall 102A of the chamber 102 wherein the wall 102A is shown dotted in FIG. 2B, a boom linkage 110, which, in the depicted embodiment, is a substantially rigid cantilever beam. The boom linkage 110 may be adapted to be rotated about a rotational axis 112 in either a clockwise or counter-clockwise rotational direction. The rotation may be provided by any suitable motive power member 111, such as a conventional variable reluctance or permanent magnet electric motor. The rotation of the boom linkage 110 may be controlled by suitable commands to the motive power member 111 from a robot apparatus controller 119.

Mounted at an outboard end 114 of the boom linkage 110, at a position spaced from the rotational axis 112, is a robot assembly 116. The robot assembly 116 may be a three-link SCARA (selective compliance assembly robot arm) robot, for example. In operation, once the boom linkage 110 is positioned adjacent to the desired destination for a put or pick of a substrate, the robot assembly 116 may be actuated to put or pick a substrate 105 to or from the destination.

Figure 2C:
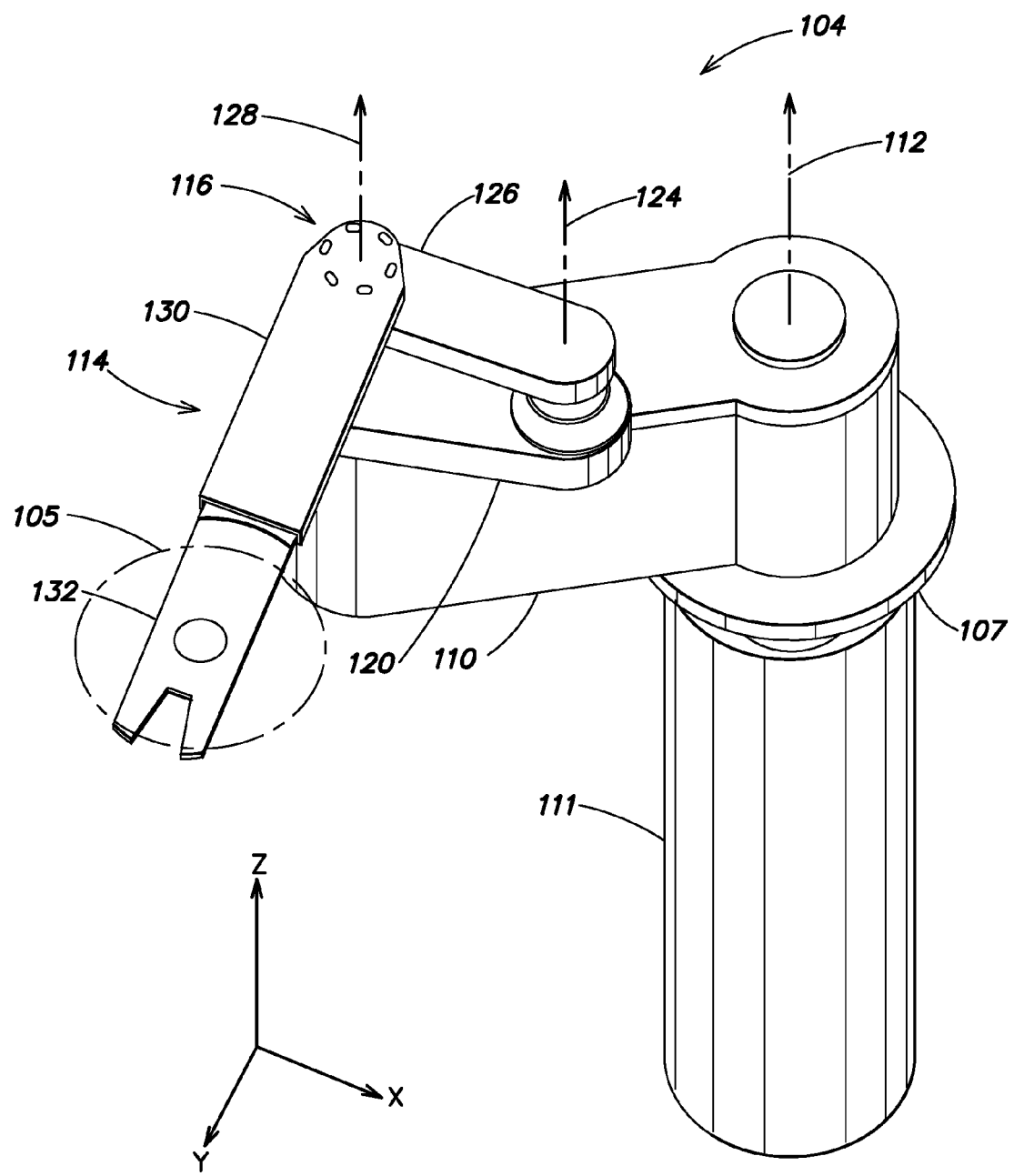
FIG. 2C is a schematic perspective view of an embodiment of a robot apparatus of FIG. 2A according to the present invention.

Now referring to FIGS. 2A-2C, a first embodiment of the robot apparatus 104 which may be adapted to be used in the substrate processing system 100 of FIG. 1 is described. As discussed above, the robot apparatus 104 may include a base 107, a boom linkage 110 rotatable relative to the base 107, and a robot assembly 116 which may be attached at an outboard end 114 of the boom linkage 110.

The robot assembly 116 may include a base 118 adapted to be attached to the boom linkage 110 and an upper arm 120, which may be adapted to be rotated in an X-Y plane relative to the base 118 and the boom linkage 110 about a shoulder axis 122. Coupled to the upper arm 120 at an elbow axis 124 located on an outboard end of the upper arm 120 may be a forearm 126. The elbow axis 124 is spaced from the shoulder axis 122. Furthermore, a wrist member 130 may be coupled to an outboard end of the forearm 126 at a wrist axis 128. The wrist axis 128 may be spaced from the elbow axis 124. The wrist member 130 may include an end effector 132 (shown partially dotted) which is adapted to carry the substrate 105 to be processed within the substrate processing system 100.

In the depicted embodiment of FIG. 1, the robot apparatus 104 is shown located and housed in a transfer chamber 102. However, it should be recognized that this embodiment of robot apparatus 104, as well as the other robot apparatus described herein, may be used in other areas of electronic device manufacturing, such as in a factory interface 138 wherein the robot apparatus may transport substrates or substrate carriers 140 between load ports 142 and load lock chambers 108 of the processing system, for example.

Figure 3A:
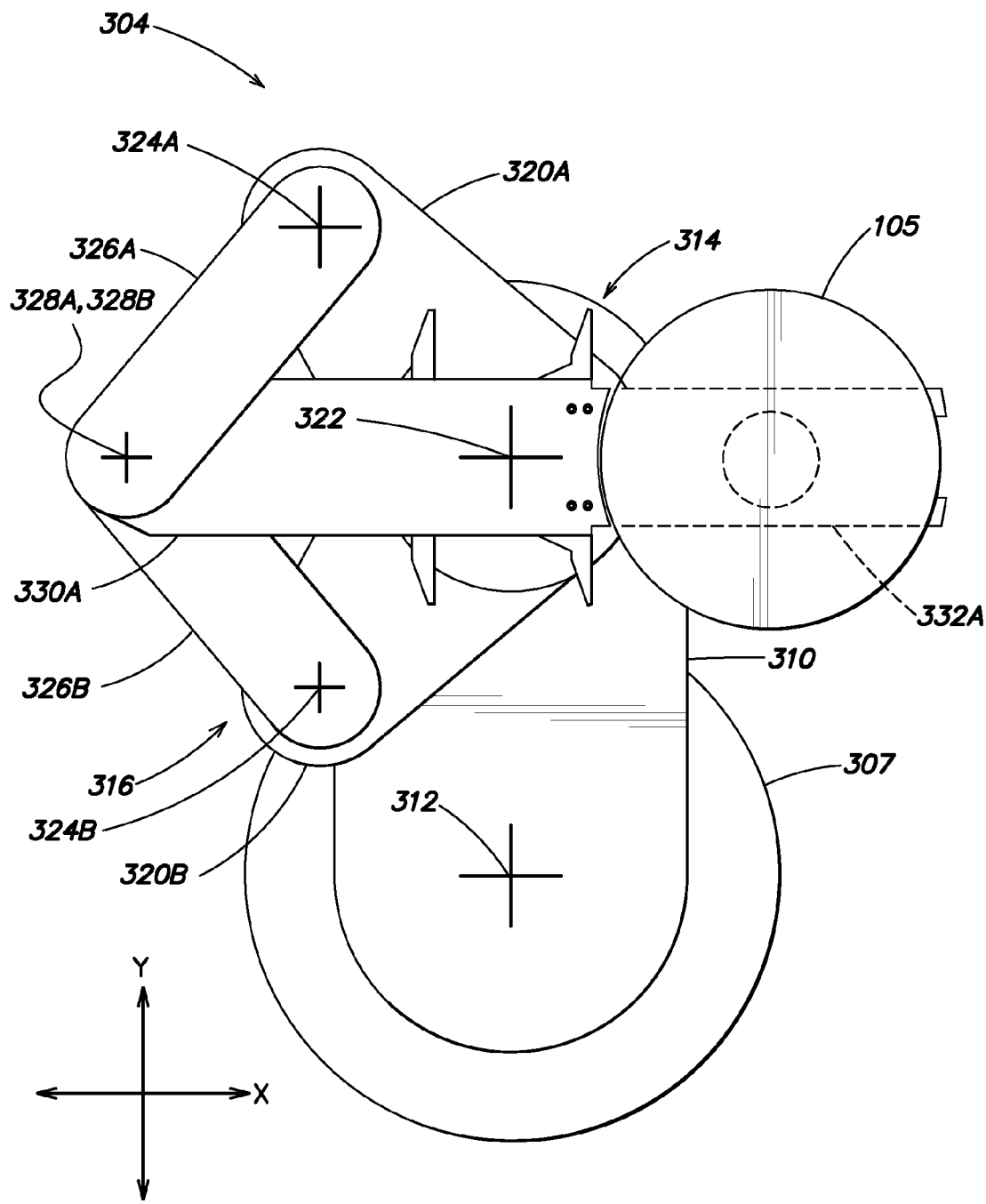
FIG. 3A is a schematic top view of another embodiment of a dual robot apparatus according to the present invention.
Figure 3B:
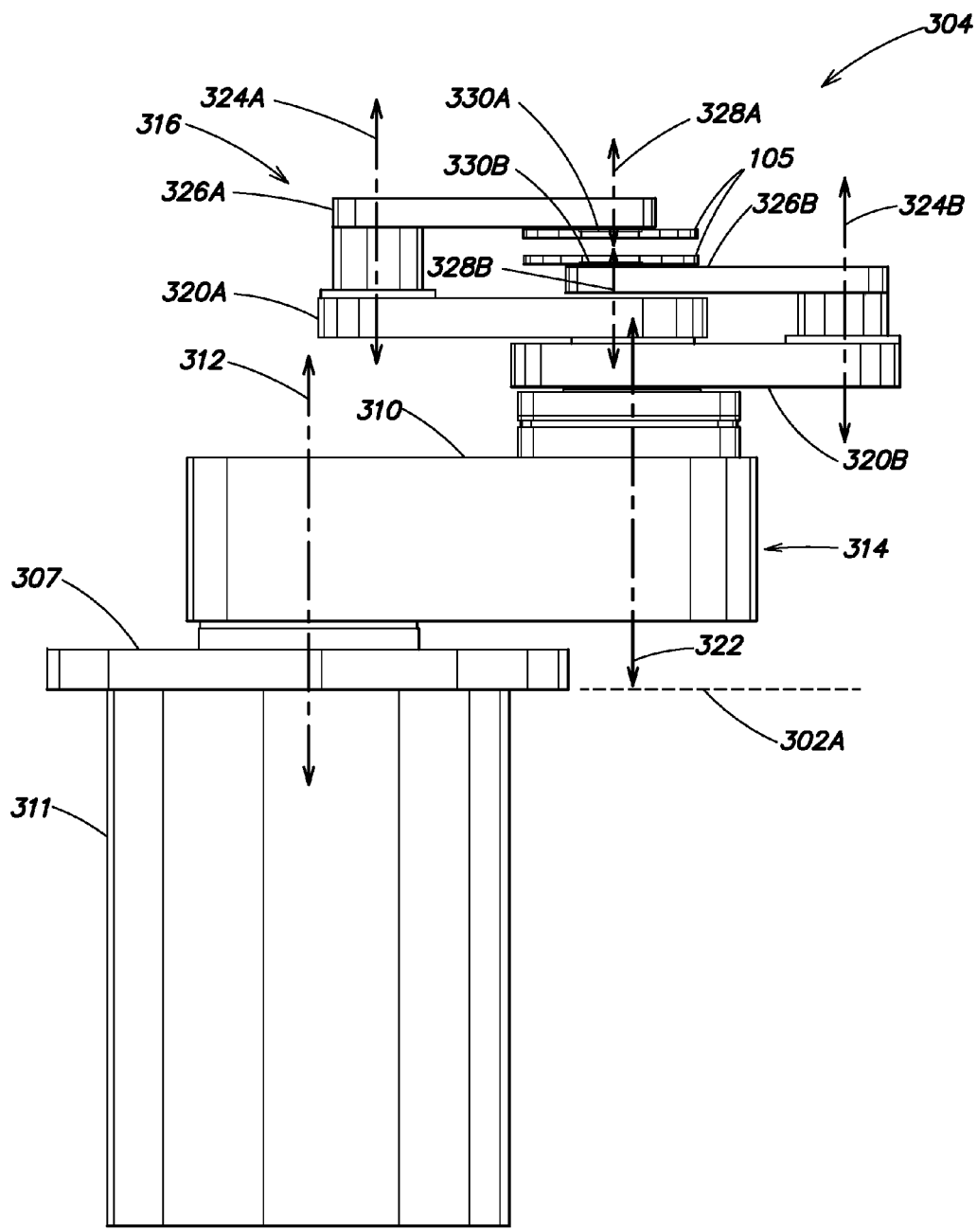
FIG. 3B is a schematic side view of an embodiment of a dual robot apparatus of FIG. 3A according to the present invention.
Figure 3C:
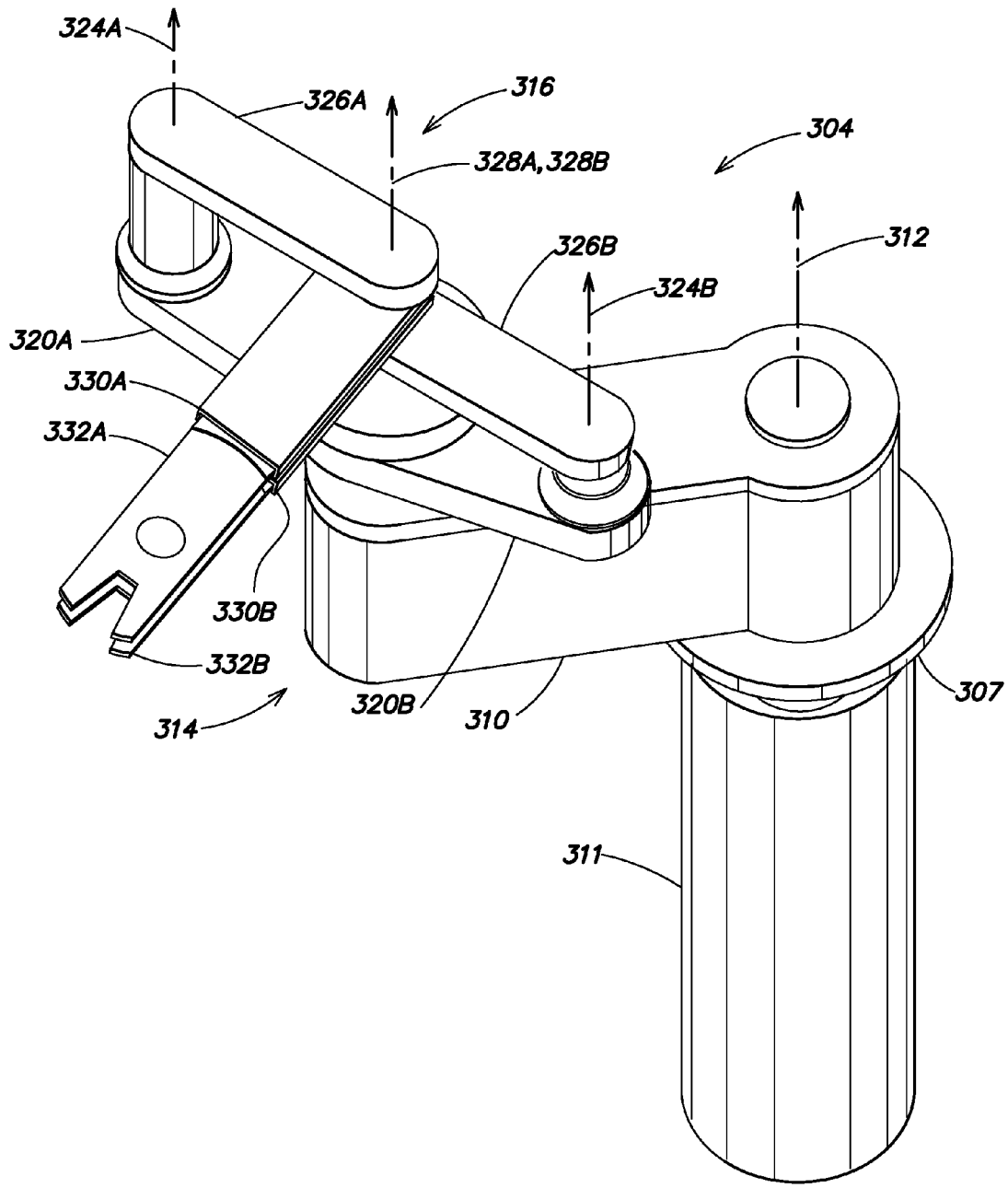
FIG. 3C is a schematic perspective view of an embodiment of a dual robot apparatus of FIG. 3A according to the present invention.

FIGS. 3A-3C illustrate another embodiment of a robot apparatus 304 that may be adapted for use within an electronic device processing system. The robot apparatus 304 in this embodiment may include a base 307 adapted to attach to a wall 302A (FIG. 3B) of a chamber, a boom linkage 310 which may be a rigid cantilever beam which may extend outward from a rotational axis 312 in a radial direction and which may be adapted for rotation about the rotational axis 312. The robot apparatus 304 may further include a dual robot assembly 316 including a dual set of arms mounted on the boom linkage 310 at an outboard end 314 spaced a distance from the rotational axis 312. In this embodiment, the robot assembly 316 may include two upper arms 320A, 320B each adapted for rotation about a shoulder axis 322. Each of the upper arms 320A, 320B may include elbow axes 324A, 324B located at their respective outboard ends and two forearms 326A, 326B may be coupled to the upper arms 320A, 320B at their respective elbow axes 324A, 324B. The forearms 326A, 326B may be adapted for rotation about their respective elbow axes 324A, 324B in the X-Y plane. The forearms 326A, 326B may each include a wrist axis 328A, 328B at their respective outboard ends at which two wrist members 330A, 330B may be coupled. The wrist members 330A, 330B are shown one overtop the other in FIG. 3A. The wrist members 330A, 330B may be adapted for rotation about their respective wrist axes 328A, 328B in an X-Y plane. End effectors 332A, 332B may be included on the wrist members 330A, 330B. The end effectors 332A, 332B may be attached to the wrist members 330A, 330B as a separate member or may be formed as an integral unit with the wrist members 330A, 330B. The end effectors 332A, 332B and substrates 105 carried by the end effectors 332A, 332B are shown one overtop the other in FIG. 3A. For clarity, the substrates 105 are not shown in FIG. 3C. Each of the boom linkage 310, upper arms 320A, 320B, forearms 326A, 326B, and wrist members 330A, 330B may be driven remotely by a motive power member 311, such as a variable reluctance or permanent magnet electric motor which may be included in a motor housing, for example.

Figure 4A:
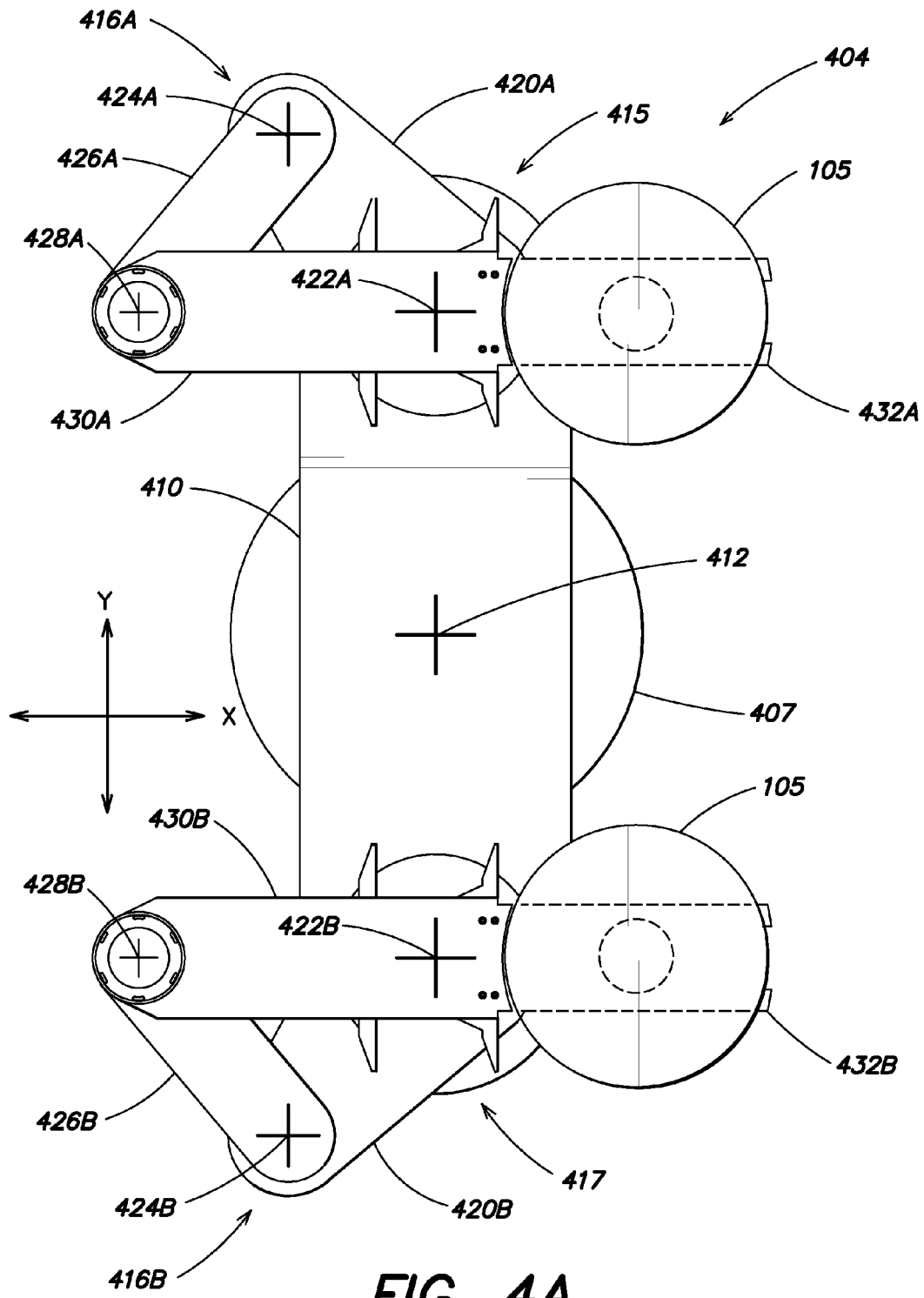
FIG. 4A is a schematic top view of an embodiment of a robot apparatus according to the present invention.
Figure 4B:
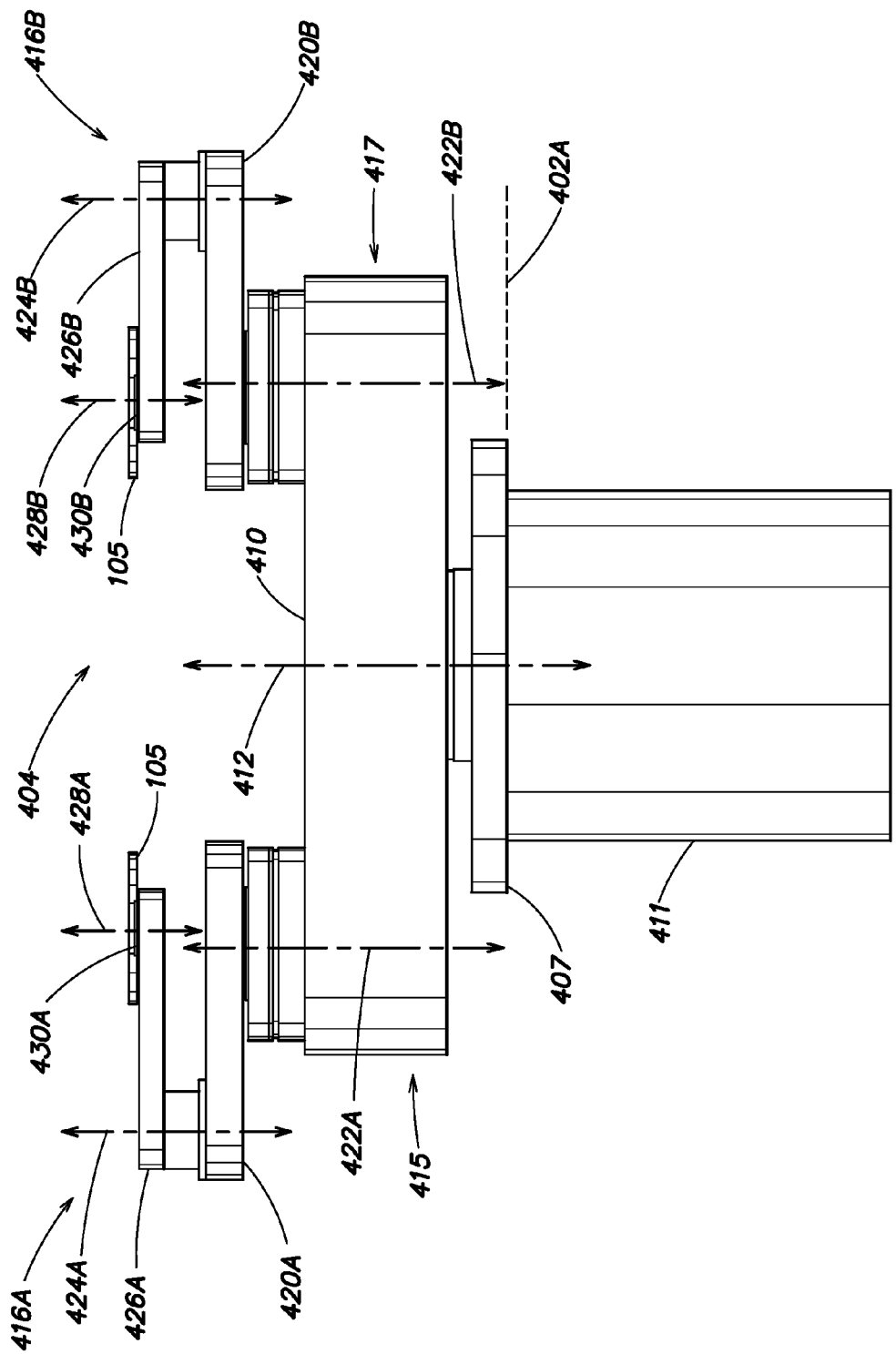
FIG. 4B is a schematic side view of an embodiment of a robot apparatus of FIG. 4A according to the present invention.

FIGS. 4A-4B illustrate another embodiment of a robot apparatus 404 that may be adapted for use within an electronic device processing system. This robot apparatus 404 may be capable of servicing two chambers at once, for example. The robot apparatus 404 in this embodiment may include a centrally-located base 407 adapted to be attached to a wall 402A (FIG. 4B) of a chamber, such as a wall of a transfer chamber for example, and a boom linkage 410, which may include multiple rigid cantilever beams extending outward in opposite radial directions from a rotational axis 412. The boom linkage 410 may be adapted for rotation about the rotational axis 412 relative to the base 407 and may include robot assemblies 416A, 416B mounted at both a first end 415 and a second end 417 of the boom linkage 410 wherein each robot assembly 416A, 416B is spaced a distance from the rotational axis 412 wherein the first end 415 is opposite the second end 417 and spaced on opposite sides of the rotational axis 412.

In this embodiment, each robot assembly 416A, 416B may include an upper arm 420A, 420B adapted for rotation about their respective shoulder axes 422A, 422B in an X-Y plane. The upper arms 420A, 420B may include elbow axes 424A, 424B located at their respective outboard ends of the upper arms 420A, 420B, and two forearms 426A, 426B coupled to the upper arms 420A, 420B at their respective elbow axes 424A, 424B. The forearms 426A, 426B may each include wrist axes 428A, 428B at which wrist members 430A, 430B attach. The wrist members 430A, 430B are adapted for rotation about the wrist axes 428A, 428B in an X-Y plane. End effectors 432A, 432B may be included on the wrist members 430A, 430B. The end effectors 432A, 432B may be attached to the wrist members 430A, 430B as a separate member or may be formed as an integral unit with the wrist members 430A, 430B. The end effectors 432A, 432B may each be adapted to carry a substrate 105. The boom linkage 410, the upper arms 420A, 420B, forearms 426A, 426B, and wrist members 430A, 430B may be driven remotely by a motive power member 411, such as a variable reluctance or permanent magnet electric motor, which may be included in a motor housing, for example.

Figure 5A:
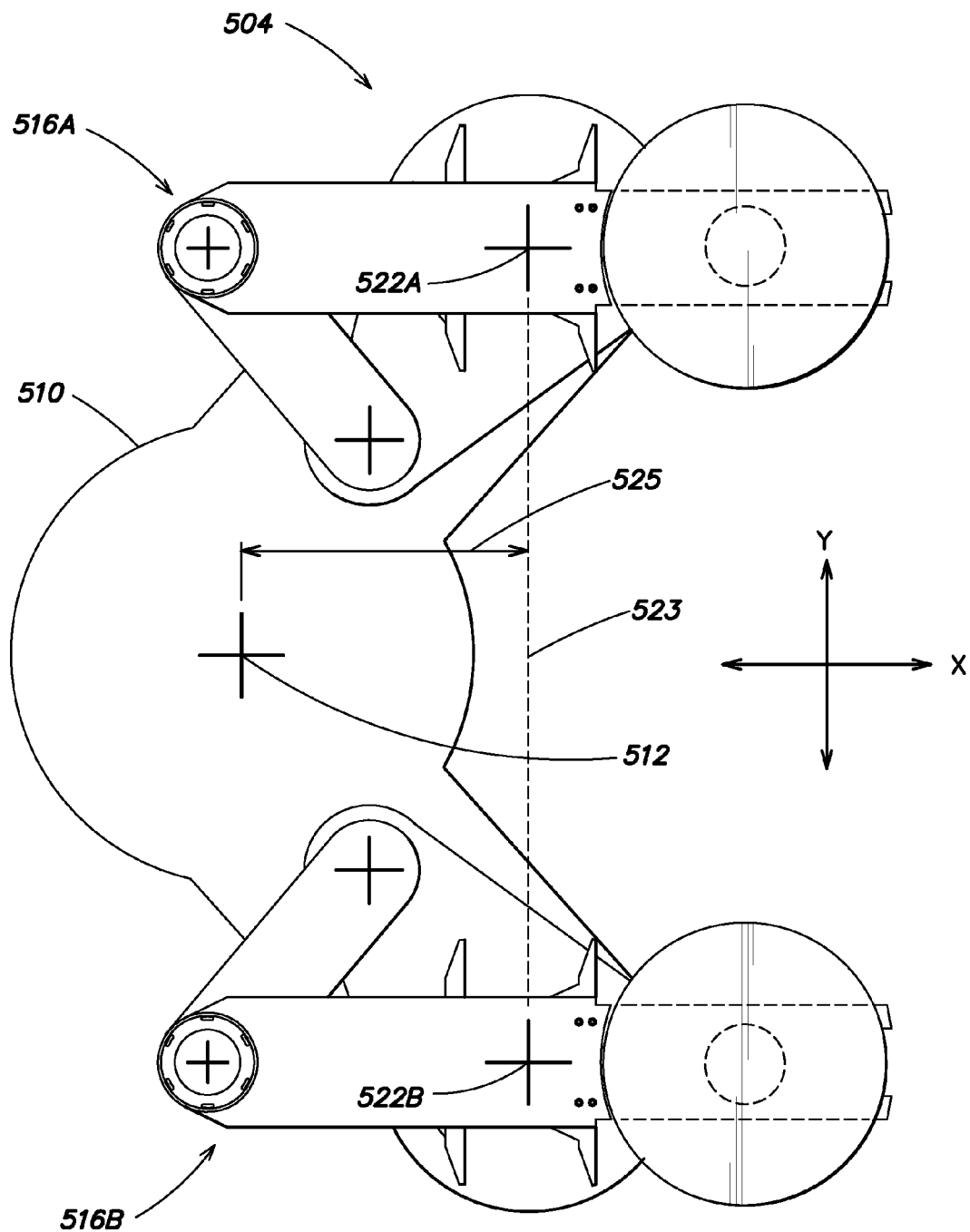
FIG. 5A is a schematic top view of an embodiment of a robot apparatus according to the present invention.
Figure 5B:
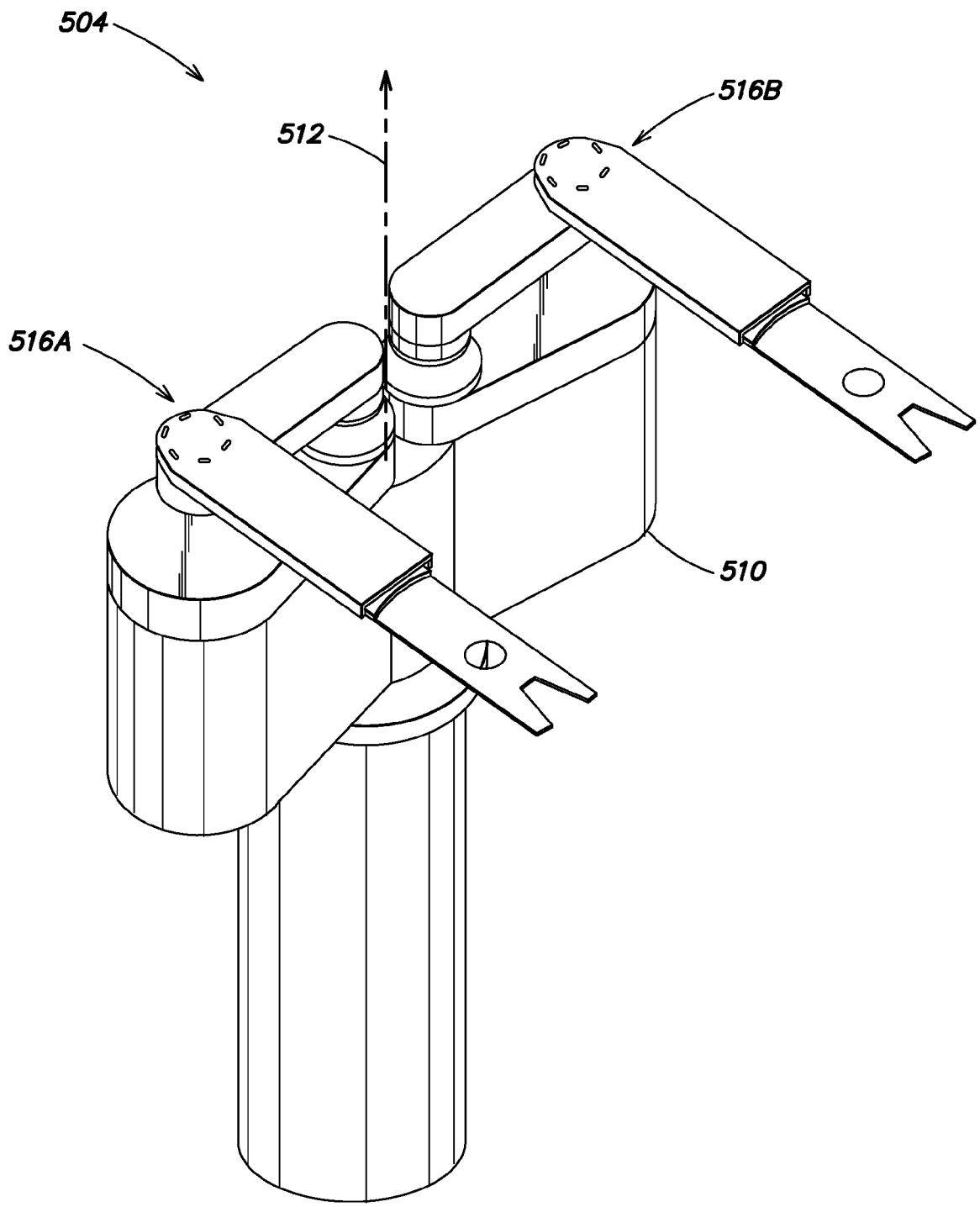
FIG. 5B is a schematic perspective view of an embodiment of a robot apparatus of FIG. 5A according to the present invention.

FIGS. 5A and 5B illustrate another embodiment of a robot apparatus 504 that may be utilized within electronic device processing systems. The robot apparatus 504 of FIGS. 5A and 5B is the same as the embodiment described with reference to FIGS. 4A and 4B except that the boom linkage 510 includes cantilevered portions that may extend radially outward in the X-Y plane from a rotational axis 512, but do so such that a line 523, when viewed in top plan view, passing through the respective shoulder axes 522A, 522B of the respective robot assemblies 516A, 516B may be offset a distance 525 from the rotational axis 512. This configuration of the boom linkage 510 may be advantageous for use in nonfocalized substrate processing systems, such as the six process chamber system shown in FIG. 9, for example. Utilizing the boomerang-shaped boom linkage 510 allows the robot assemblies 516A, 516B to be moved even closer to the chambers they service. Accordingly, the robot arms may be made even shorter. In some embodiments, an included angle formed by connecting axes 522A, 512 and 522B is less than 180 degrees, less than about 150 degrees, or even less than about 120 degrees.

Figure 6A:
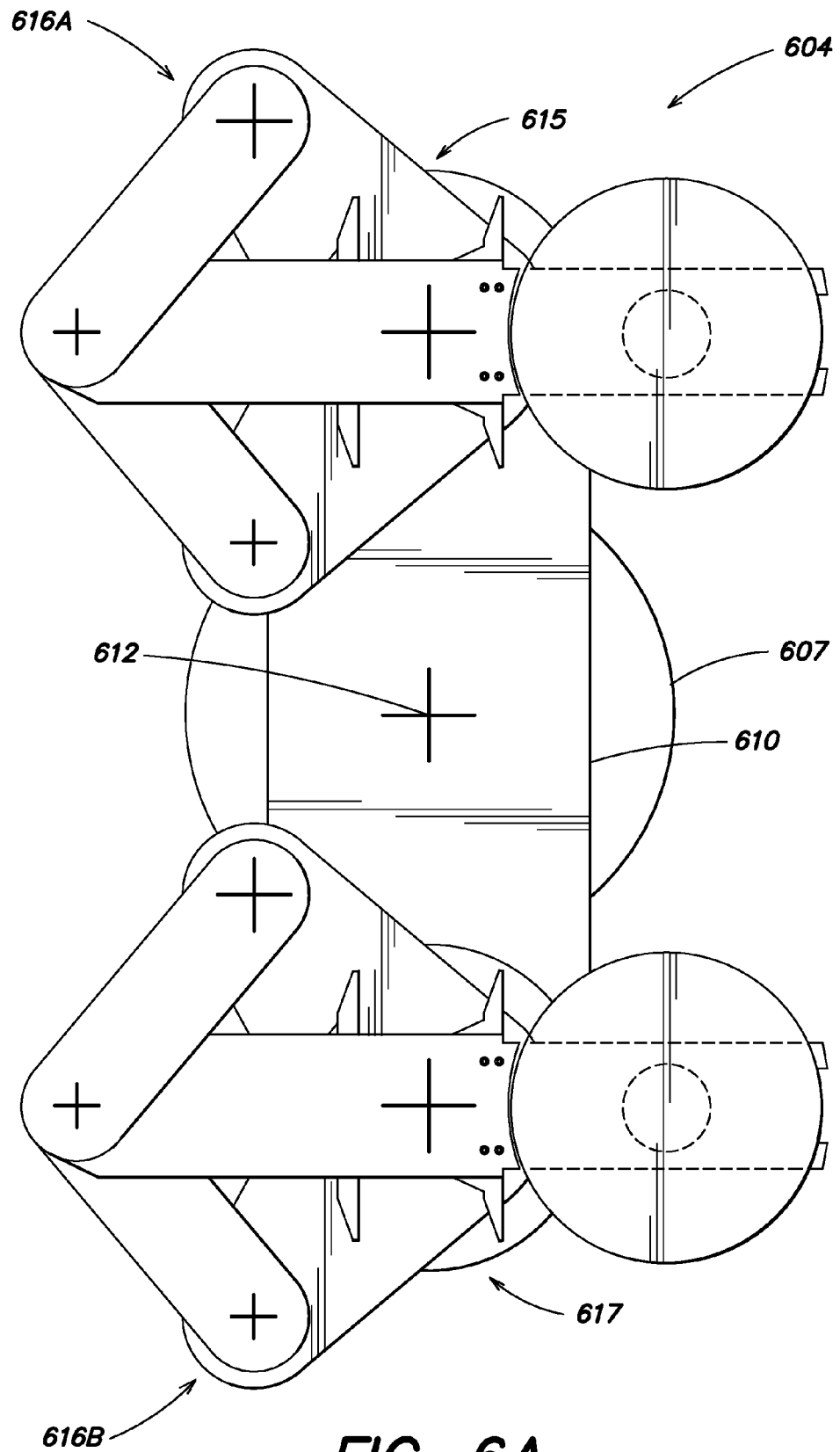
FIG. 6A is a schematic top view of an embodiment of a robot apparatus according to the present invention.

FIGS. 6A and 6B illustrate yet another embodiment of a robot apparatus 604 that may be utilized within an electronic device processing system. As in the previous embodiments, the apparatus 604 may include a base 607 adapted to attach to a wall 602A (FIG. 6B) of a chamber, a boom linkage 610 which may include multiple cantilever beams extending outwardly in opposite radial directions from a rotational axis 612 of the boom linkage 610. The boom linkage 610 may be adapted for rotation about a rotational axis 612 relative to the base 607 and may include robot assemblies 616A, 616B mounted at both a first end 615 and a second end 617 of the boom linkage 610; each of the assemblies 616A, 616B are mounted at a position spaced a distance from the rotational axis 612. The robot assemblies 616A, 616B are the same dual robot assemblies that are described with reference to FIGS. 3A-3C and will not be repeated again herein. As in the previous embodiments, each of the boom linkage 610, and robot assemblies 616A, 616B may be driven remotely by a motive power member 611, such as a variable reluctance or permanent magnet electric motor which may be included in a motor housing, for example.

Figure 7A:
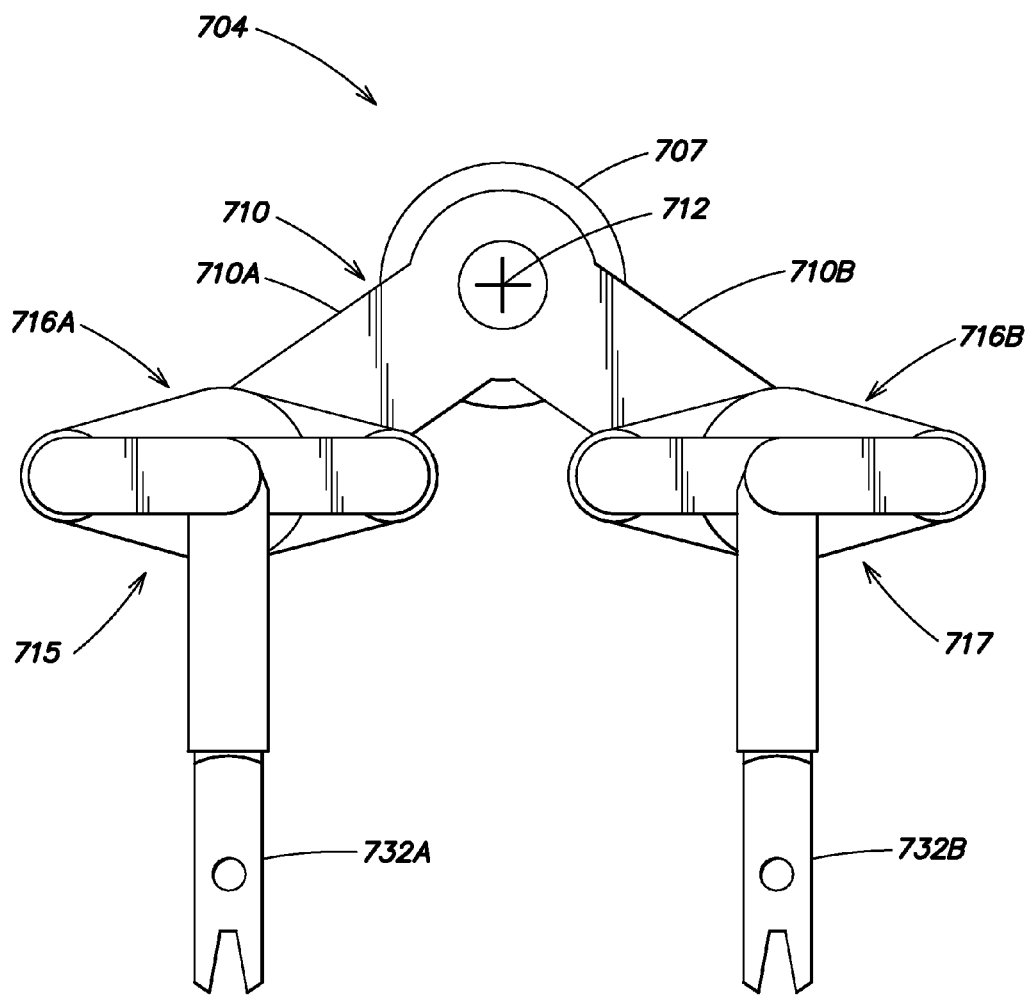
FIG. 7A is a schematic top view of an embodiment of a dual robot apparatus according to the present invention.
Figure 7B:
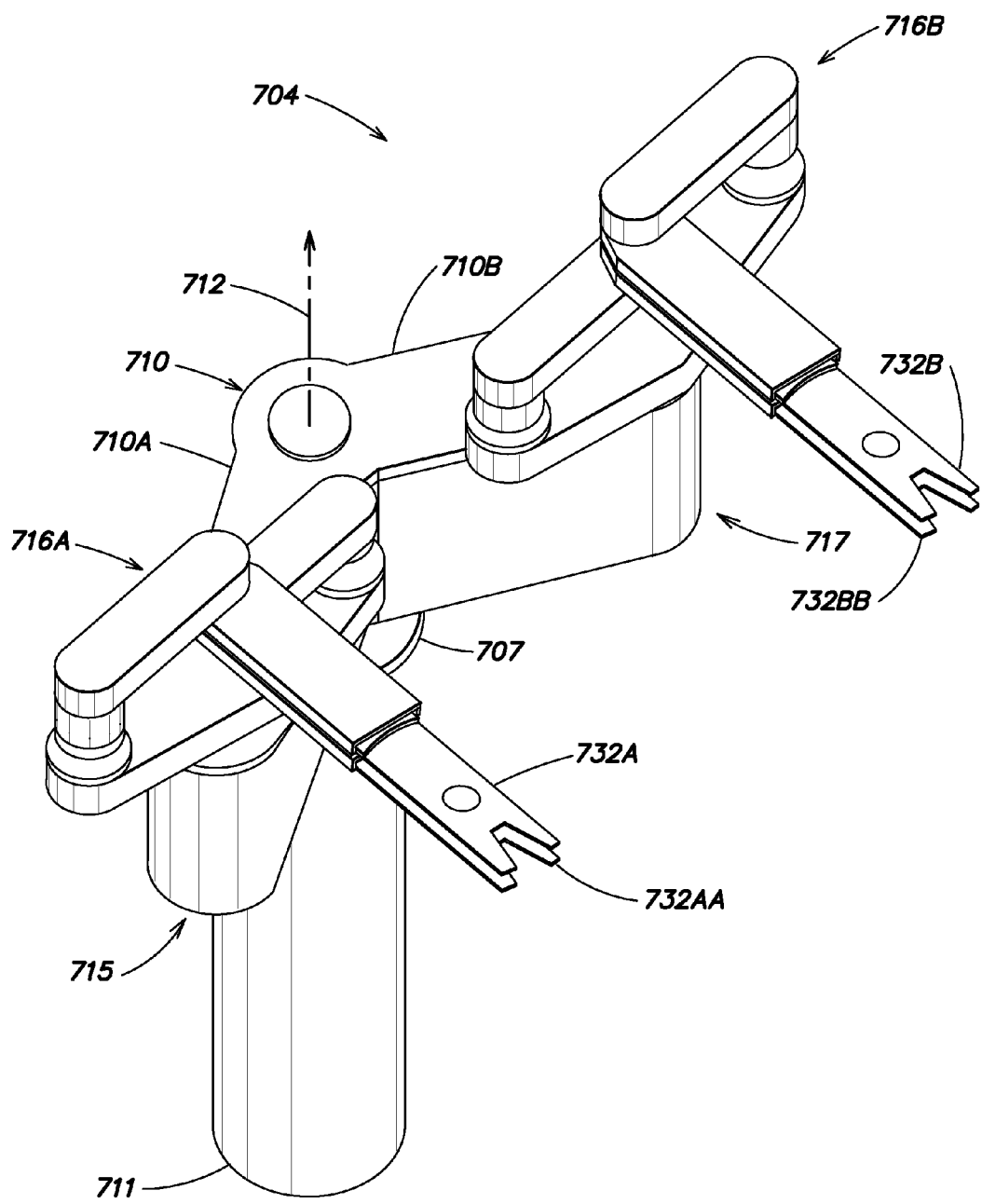
FIG. 7B is a schematic perspective view of an embodiment of a robot apparatus of FIG. 7A according to the present invention.

FIGS. 7A and 7B illustrate yet another embodiment of a robot apparatus 704 that may be utilized within an electronic device processing system. As in the previous embodiments, the apparatus 704 may include a base 707, a boom linkage 710, which may include multiple cantilever beams 710A, 710B extending outwardly in generally opposite radial directions from a rotational axis 712 of the boom linkage 710. The boom linkage 710 may have a generally boomerang shape and may be adapted for rotation about the rotational axis 712. Robot assemblies 716A, 716B may be mounted at first end 715 and second end 717 of the boom linkage 710. The robot assemblies 716A, 716B may be the same dual robot assemblies that are described with reference to FIGS. 3A-3C and will not be described again herein.

As in the previous embodiments, each of the boom linkage 710 and robot assemblies 716A, 716B may be driven remotely by a motive power member 711, such as a variable reluctance or permanent magnet electric motor which may be included in a motor housing, for example. In particular, the boom linkage 710 and the robot assemblies 716A, 716B may be driven from outside of a chamber in which the boom linkage 710 and the robot assemblies 716A, 716B are housed. In this depicted embodiment, the boom linkage 710 may be advantageous for use in nonfocalized substrate processing systems, such as the six process chamber system shown in FIG. 9, for example. Utilizing the boomerang-shaped boom linkage 710 may allow the robot assemblies 716A, 716B to be moved very close to the chambers they service. With the dual robots apparatus, a complete substrate exchange may be made at a destination possibly without needing to rotate the boom linkage 710. However, given that the boom linkage 710 moves the robot assemblies 716A, 716B very close to the chambers being serviced, the overall size of the robot assemblies 716A, 716B may be made relatively smaller than in conventional systems.

Thus, in operation, the boom linkage 710 having a robot assembly 716A mounted at a first end 715 will be first rotated about the rotational axis 712 to place the first end 715 of the boom linkage 710 adjacent to a first destination, i.e., at a position where the robot assembly 716A may readily access the destination. The robot assembly 716A may then be actuated; first to pick a substrate from the destination with one end effector 732A of the robot assembly 716A, and then to place a substrate with the other end effector 732AA of the robot assembly 716A. After this, the second end 717 of the boom linkage 710 may be rotated adjacent to a second destination where the robot assembly 716B may carry out another complete substrate exchange with the end effectors 732B, 732BB at the second destination in the same manner as described for the first assembly 716A. Of course because of the offset in the boom linkage 710 in this embodiment, complete exchanges may not require any further rotation of the boom linkage 710 or possibly only a small amount of additional rotation. For example, the boom linkage 710 may be rotated to an intermediate location where both robot assemblies 716A, 716B may readily reach the two destinations for substrate exchanges. The exchanges may be carried out, either sequentially or simultaneously.

Figure 8:
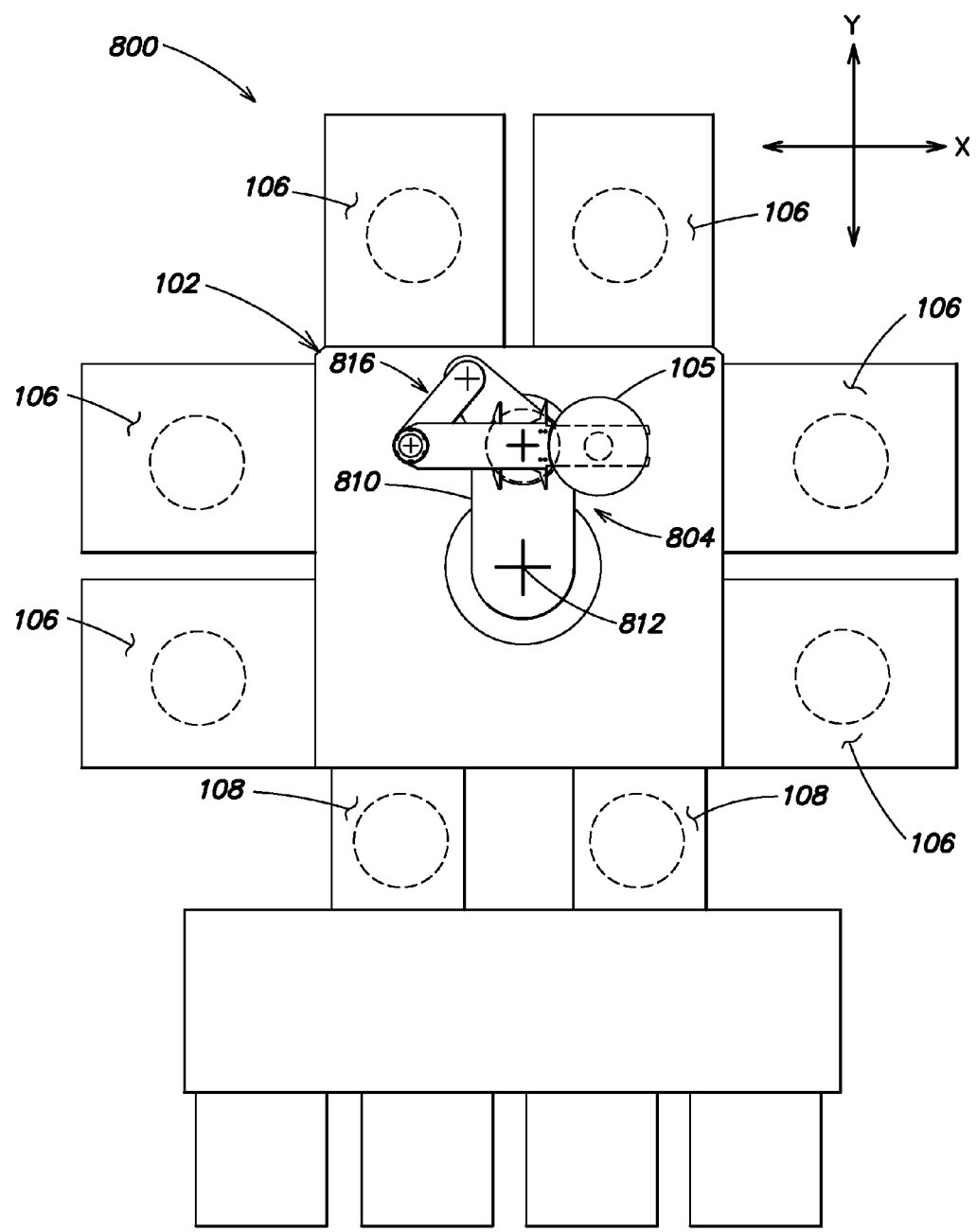
FIG. 8 is a schematic top view of another embodiment of a substrate processing system including a robot apparatus of FIG. 2A according to the present invention.

FIG. 8 is a schematic diagram of another exemplary embodiment of a substrate processing system 800 according to the present invention. The substrate processing system 800 may include a transfer chamber 102 within which a robot apparatus 804 may be housed. The robot apparatus 804 may be adapted to put or pick a substrate 105 to or from a destination in the system 800. The destination may be a chamber coupled to the transfer chamber 102, for example, or within the chamber itself. For example, the destination may be one or more process chambers 106 and/or one or more load lock chambers 108 which may be coupled to the transfer chamber 102. In some embodiments, the transfer chamber 102 may be operated in a vacuum, for example. In operation, the boom linkage 810 of the apparatus 804 may be rotated by a suitable motive power member, such as an electric motor, in either the clockwise or counterclockwise direction about the rotational axis 812. This may position the boom linkage 810 adjacent to the destination such that the robot assembly 816 may readily put or pick a substrate 105 to or from a chamber, such as process chamber 106.

Figure 9:
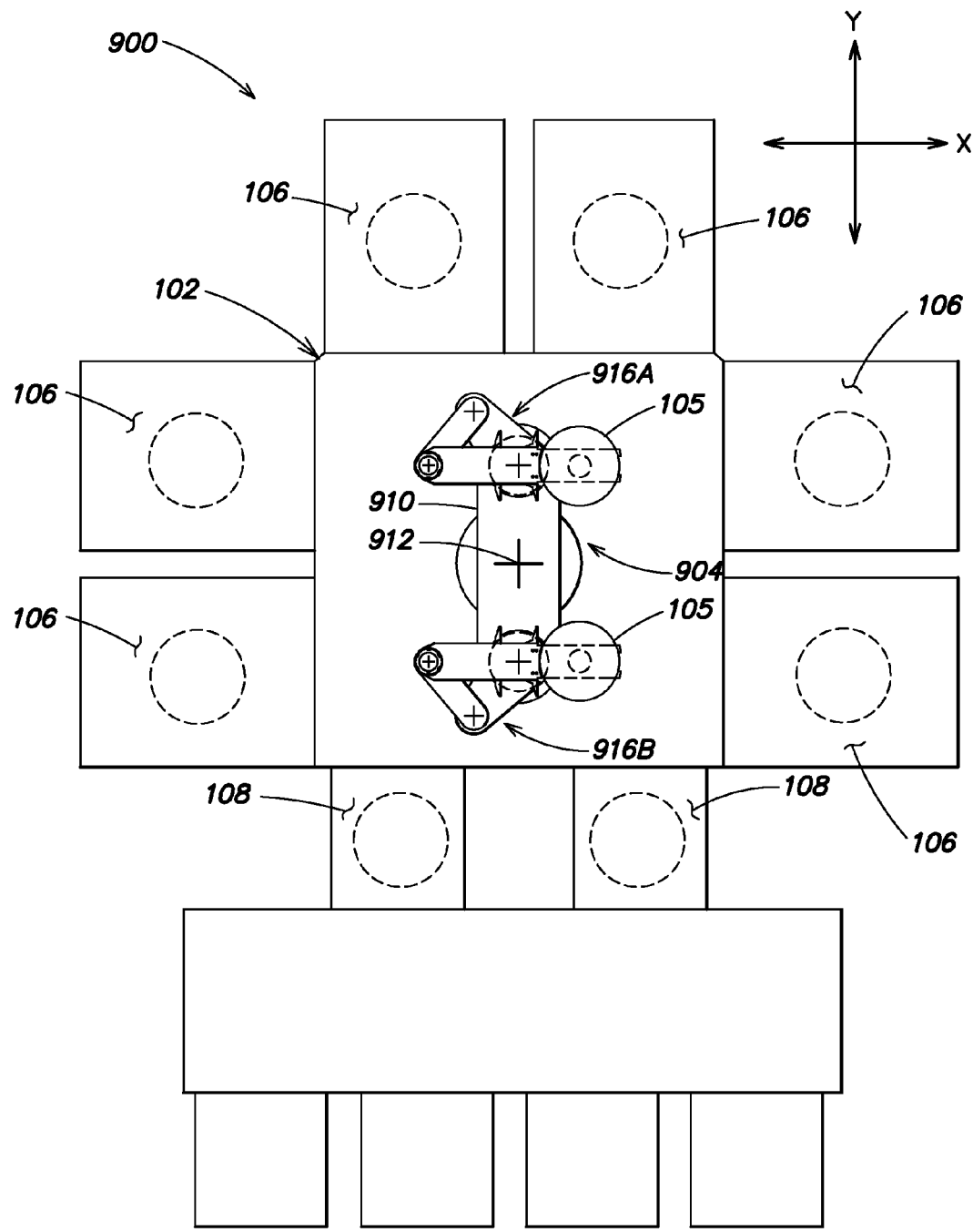
FIG. 9 is a schematic top view of another embodiment of a substrate processing system including a robot apparatus of FIG. 4A according to the present invention.

FIG. 9 is a schematic diagram of another exemplary embodiment of a substrate processing system 900 according to the present invention. The substrate processing system 900 may include a transfer chamber 102 within which a robot apparatus 904 may be housed. The robot apparatus 904 may be the same as the robot apparatus 404 shown in FIGS. 4A-4B and the details of the robot apparatus 904 will not be repeated herein. The robot apparatus 904 may be adapted to put or pick a plurality of substrates 105 to and/or from multiple destinations. Moreover, the put or pick of the plurality of substrates 105 may occur sequentially or substantially at the same time. The destinations may be chambers coupled to the transfer chamber 102. For example, the destinations may be one or more process chambers 106 and/or one or more load lock chambers 108 which may be coupled to the transfer chamber 102. In some embodiments, the transfer chamber 102 may be operated in a vacuum, for example. In operation, the boom linkage 910 of the robot apparatus 904 may be rotated by a suitable motive power member (not shown), such as an electric motor, in either the clockwise or counterclockwise direction about the rotational axis 912. This may position each end of the boom linkage 910 adjacent to the destinations such that the robot assemblies 916A, 916B may readily put or pick substrates 105 to or from a chamber, such as process chamber 106. As should be recognized, any of the other embodiments of the robot apparatus described herein may be included in a substrate processing system as shown in FIGS. 1, 8 and 9.

Figure 10:
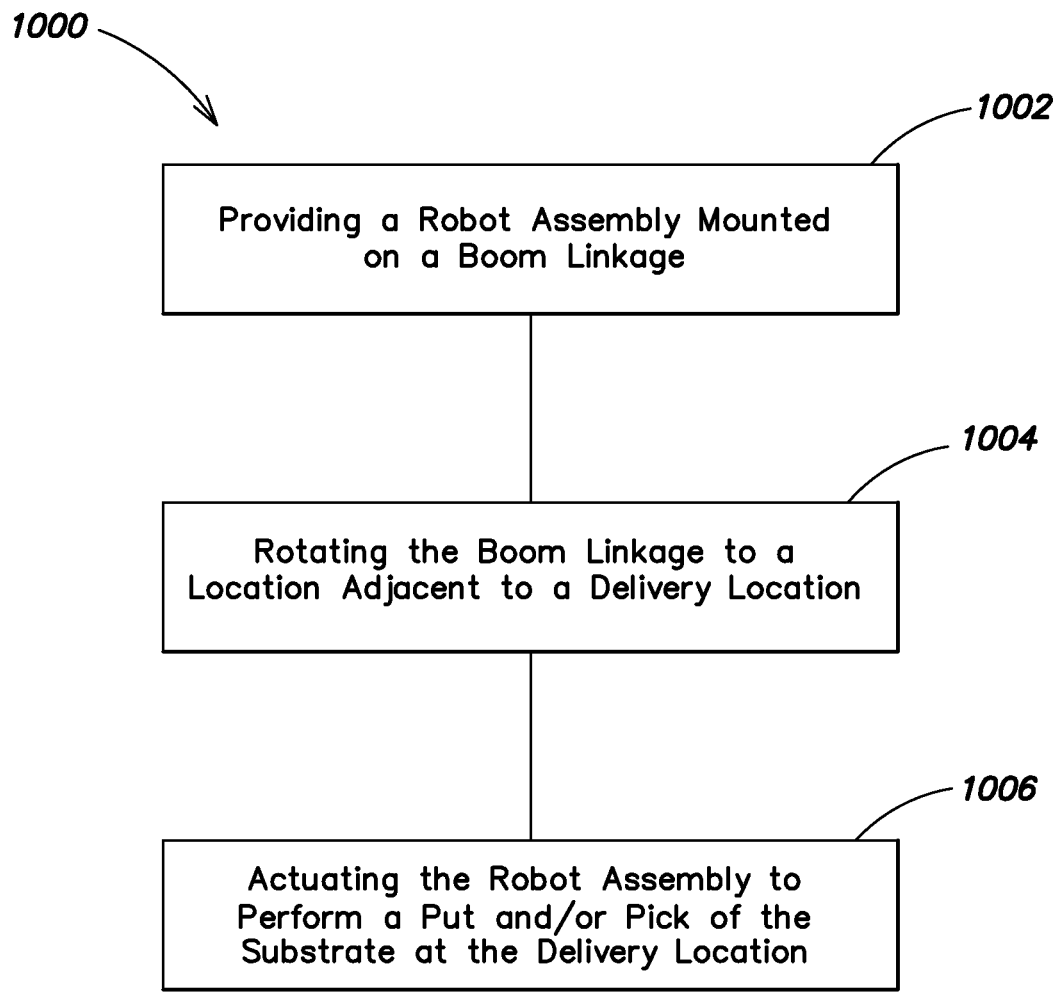
FIG. 10 is a flowchart depicting a method of operating a robot apparatus according to embodiments of the present invention.

A method 1000 of transporting a substrate within an electronic device processing system according to the present invention is provided in FIG. 10. The method 1000 may include providing a robot apparatus including a robot assembly mounted on a boom linkage in step 1002; rotating the boom linkage to a location adjacent to a delivery destination in step 1004; and actuating the robot assembly to perform at least one selected from a group consisting of a put of the substrate to the delivery destination, and a pick of the substrate from the delivery destination in step 1006. Of course, where a dual robot apparatus, such as shown in FIGS. 3A-3C, is mounted on the boom linkage, a put and a pick of a substrate may be accomplished at the destination. After the put and/or pick has been accomplished, the robot assembly may be retracted from the destination to a neutral location and the boom linkage may then be rotated to a second position adjacent to a second destination, such as another process chamber or a load lock chamber, for example, wherein the process of 1006 may be repeated. In some embodiments, the boom may be rotated further towards the destination during the forward actuation of the robot assembly to assist in the put or pick operation.

Figure 11:
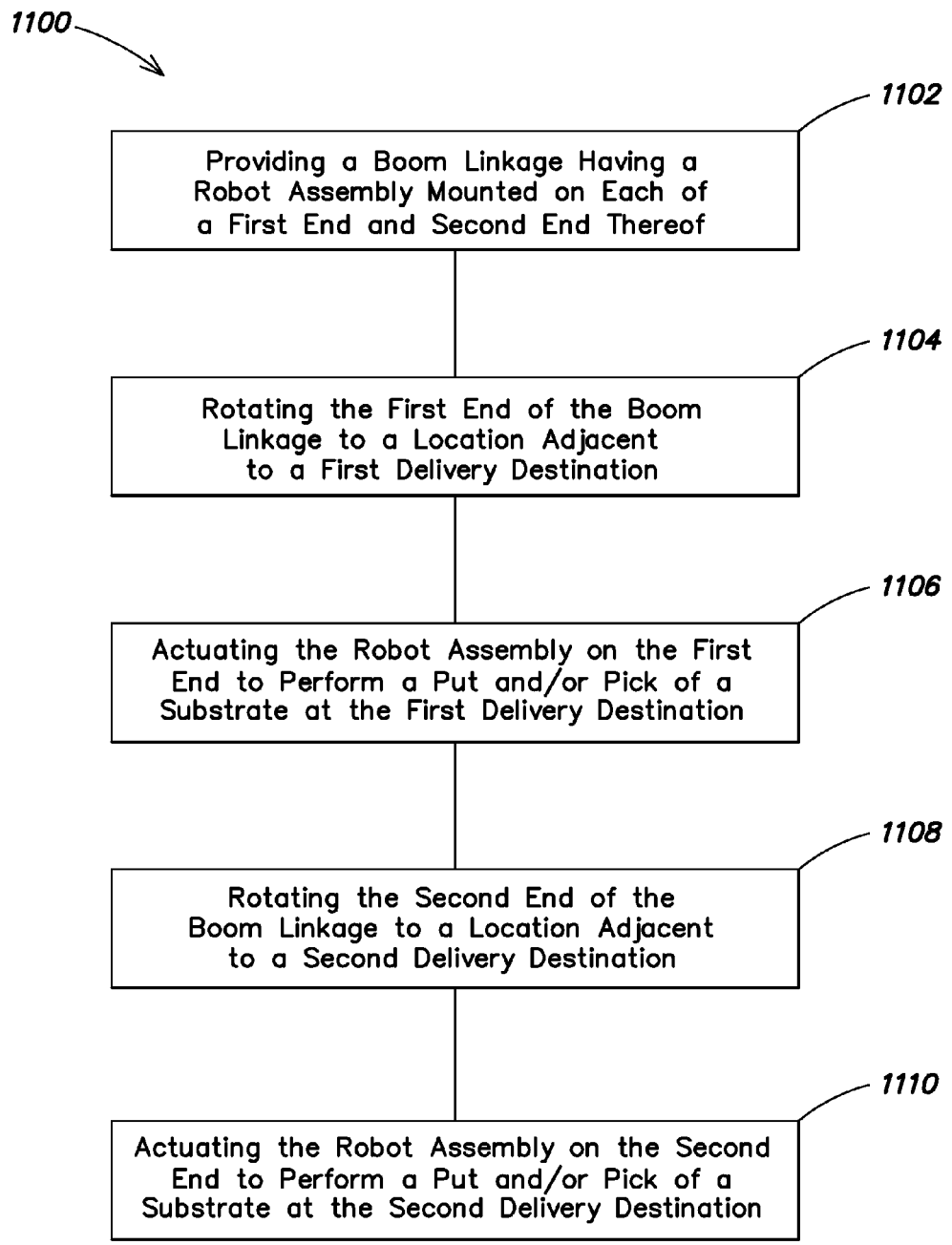
FIG. 11 is a flowchart depicting a method of operating a robot apparatus according to further embodiments of the present invention.

In the embodiments where the boom linkage includes two robot assemblies mounted thereon, such as shown in FIG. 9, a method as best described with reference to FIG. 11 may be employed. The method 1100 may include providing a robot apparatus including a robot assembly mounted on each of a first and a second end of a boom linkage in step 1102; rotating the first end of the boom linkage to a location adjacent to a first delivery destination in 1104; and actuating the robot assembly to perform at least one selected from a group consisting of a put of the substrate to the first delivery destination, and a pick of the substrate from the first delivery destination in 1006. After the put and/or pick has been accomplished at the first destination, the robot assembly may be retracted from the first destination to a neutral location and the second end of the boom linkage may be rotated to a second position adjacent to a second destination in 1108, such as adjacent to another process chamber or load lock chamber, for example. The robot assembly mounted to the second end may then be actuated to perform at least one selected from a group consisting of a put of the substrate to the second delivery destination, and a pick of the substrate from the second delivery destination in 1110. Thereafter, the boom linkage may be rotated to another destination wherein the process of 1106 may be repeated.

Figure 12:
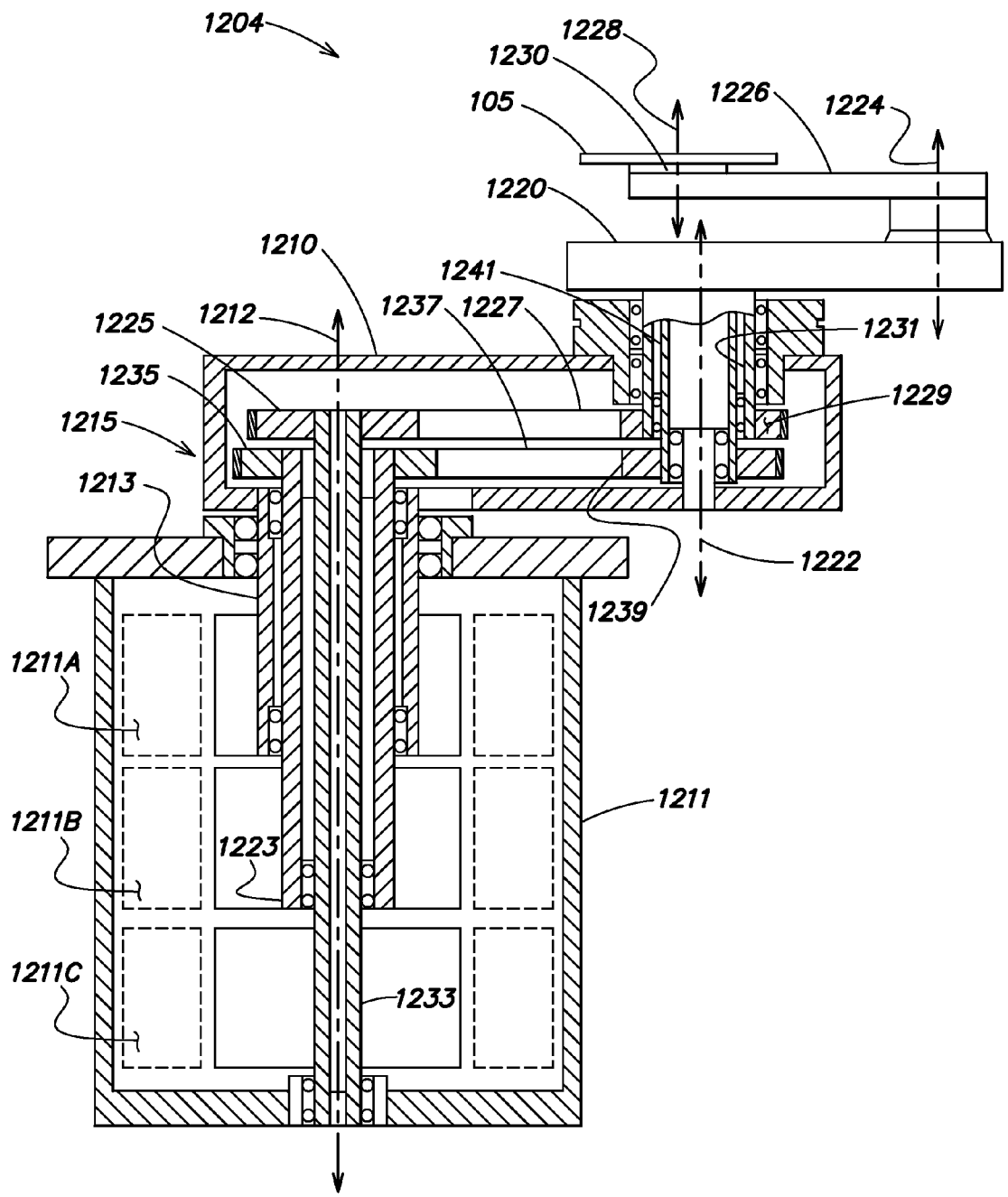
FIG. 12 is a partially cross-sectioned side view of a robot apparatus illustrating one possible drive system according to the present invention.

FIG. 12 illustrates an exemplary drive system 1215 for driving the various components of the robot apparatus 1204. First, the drive system 1215 may include drive components adapted to rotate the boom linkage 1210 about the rotational axis 1212. A pilot 1213 may extend from the boom linkage 1210 and may be supported by suitable bearings wherein the pilot 1213 is adapted to be rotated by a component motor 1211A of a motive power member 1211 about the rotational axis 1212. The motor component 1211A may be an electrical motor including a rotor and stator, for example.

Further, the drive system 1215 may include drive components adapted to rotate the upper arm 1220 about the shoulder axis 1222. The drive components may include a drive shaft 1233 coupled to a drive pulley 1225, a metal belt 1227, and a driven pulley 1229 coupled to the upper arm 1220 by a second pilot 1231. Rotation of a motor component 1211C causes rotation of the shaft 1233 and drive pulley 1225 and drives the driven pulley 1229 thereby rotating the pilot 1231 and attached upper arm 1220 about the shoulder axis 1222. The motor component 1211C may be an electrical motor including a rotor and stator, for example.

Similarly, the drive system 1215 may include drive components adapted to rotate the forearm 1226 about the elbow axis 1224. The drive components may include a second drive shaft 1223 coupled to a second drive pulley 1235, a metal belt 1237, and a second driven pulley 1239 coupled to the forearm 1226 and the wrist member 1230 by a third shaft 1241, which may be connected to conventional SCARA belts and pulleys located in the upper arm 1220 and forearm 1226. Rotation of a motor component 1211B causes rotation of the second drive shaft 1223 and drive pulley 1235 and drives the second driven pulley 1239 thereby rotating the third shaft 1241. Rotation of the third shaft 1241 rotates the forearm 1226 about an elbow axis 1224 and also rotates the wrist member 1230 about a wrist axis 1228. The motor component 1211B may also be an electrical motor including a rotor and stator, for example. Suitable conventional rotational encoders (not shown) may be used to position the boom 1210 and upper arm 1220 and forearm 1226 as desired. Additional nested shafts and pulleys may be added to drive robot apparatus with dual end effectors and dual robot apparatus. Further, independent rotation of the wrist member to provide independent yaw motion about axis 1228 may be provided, as will be discussed further below.

As should be apparent, this drive system 1215 may be used to drive the robot apparatus 1204 of FIGS. 2A-2C, and may be modified to drive the robot apparatus of the embodiment of FIGS. 4A-4B and FIGS. 5A and 5B, via generating an exact mirror duplicate of the components described above and extending them to the left of the centerline 1212. These mirrored components would couple the respective belts thereof to identical pulleys adjacent to the pulleys 1225 and 1235. In this way, a single motor component such as 1211C may cause the rotation of upper arm 1220 and a corresponding upperarm (in the opposite direction) attached to a radial boom extension on the other end (e.g., 415) of the boom. Similarly, motor component 1211B may cause the rotation of forearm 1426 and rotation (in the opposite direction) of a corresponding forearm attached to the boom extension on the other end of the boom (e.g., 410).

Figure 13:
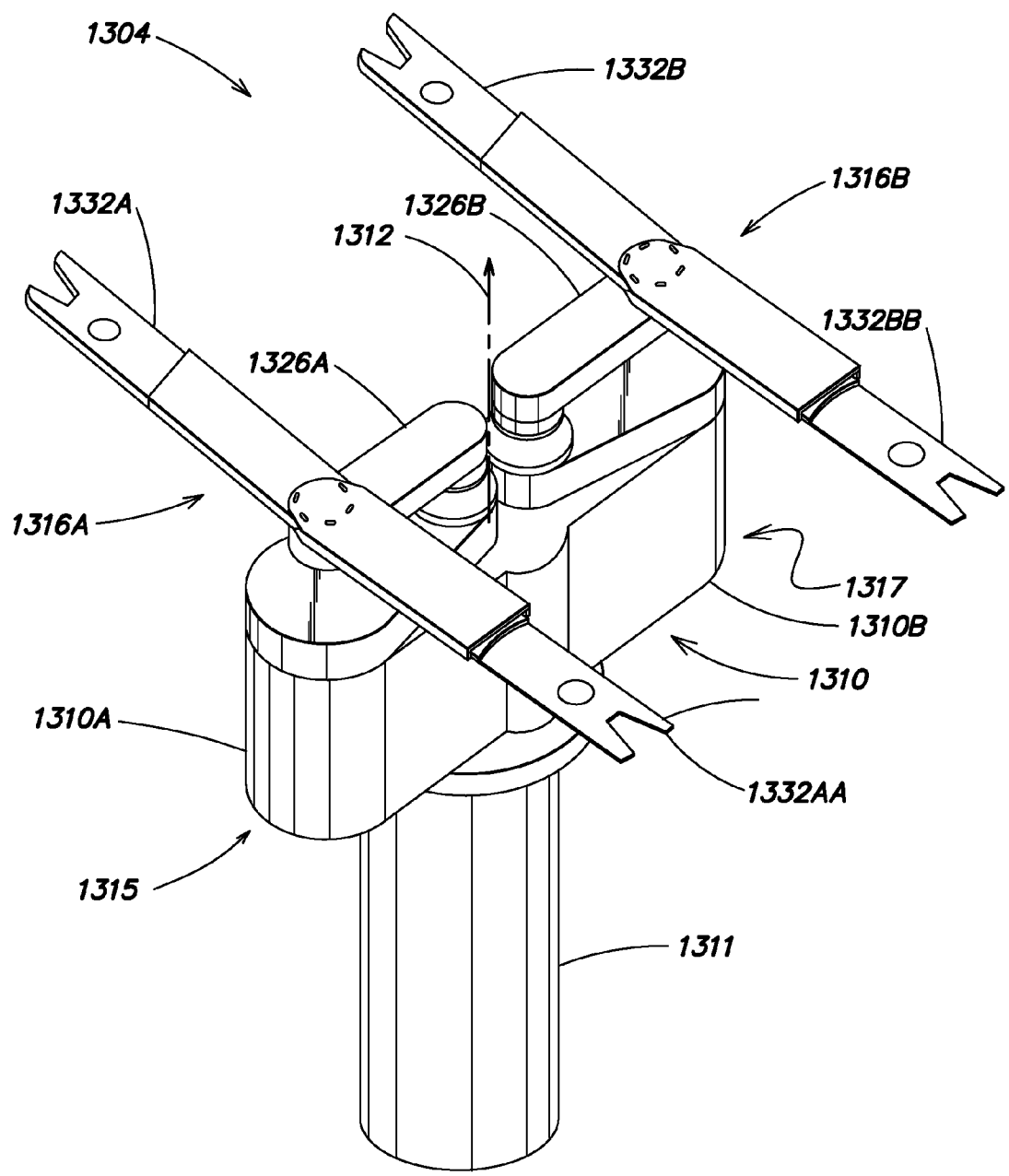
FIG. 13 is a perspective view of another robot apparatus illustrating dual end effectors according to the present invention.

FIG. 13 illustrates yet another embodiment of a robot apparatus 1304 that may be utilized within an electronic device processing system. As in the previous embodiments, the robot apparatus 1304 may include a boom linkage 1310 which may include multiple cantilever beams 1310A, 1310B extending outwardly in opposite radial directions from a rotational axis 1312 of the boom linkage 1310. The boom linkage 1310 may be adapted for rotation about the rotational axis 1312 and may include robot assemblies 1316A, 1316B mounted at both a first end 1315 and a second end 1317 of the boom linkage 1310. The robot assemblies 1316A, 1316B are the same dual robot assemblies that are described with reference to FIGS. 4A-4B, except that rather than one, two end effectors 1332A, 1332AA and 1332B and 1332BB may be attached to the respective forearms 1326A, 1326B. As in the previous embodiments, each of the boom linkage 1310, and robot assemblies 1316A, 1316B may be driven remotely by a motive power member 1311, such as a variable reluctance or permanent magnet electric motor which may be included in a motor housing, for example. As the forearm 1326B is caused to rotate when picking and/or placing a substrate (not shown), the end effectors 1332B, 1332BB may remain in a fixed orientation relative to each other, i.e., they may remain aligned. Similarly, as forearm 1326A is caused to rotate when picking and/or placing a substrate (not shown), the end effectors 1332A, 1332AA may remain in a fixed orientation relative to each other.

Figure 14:
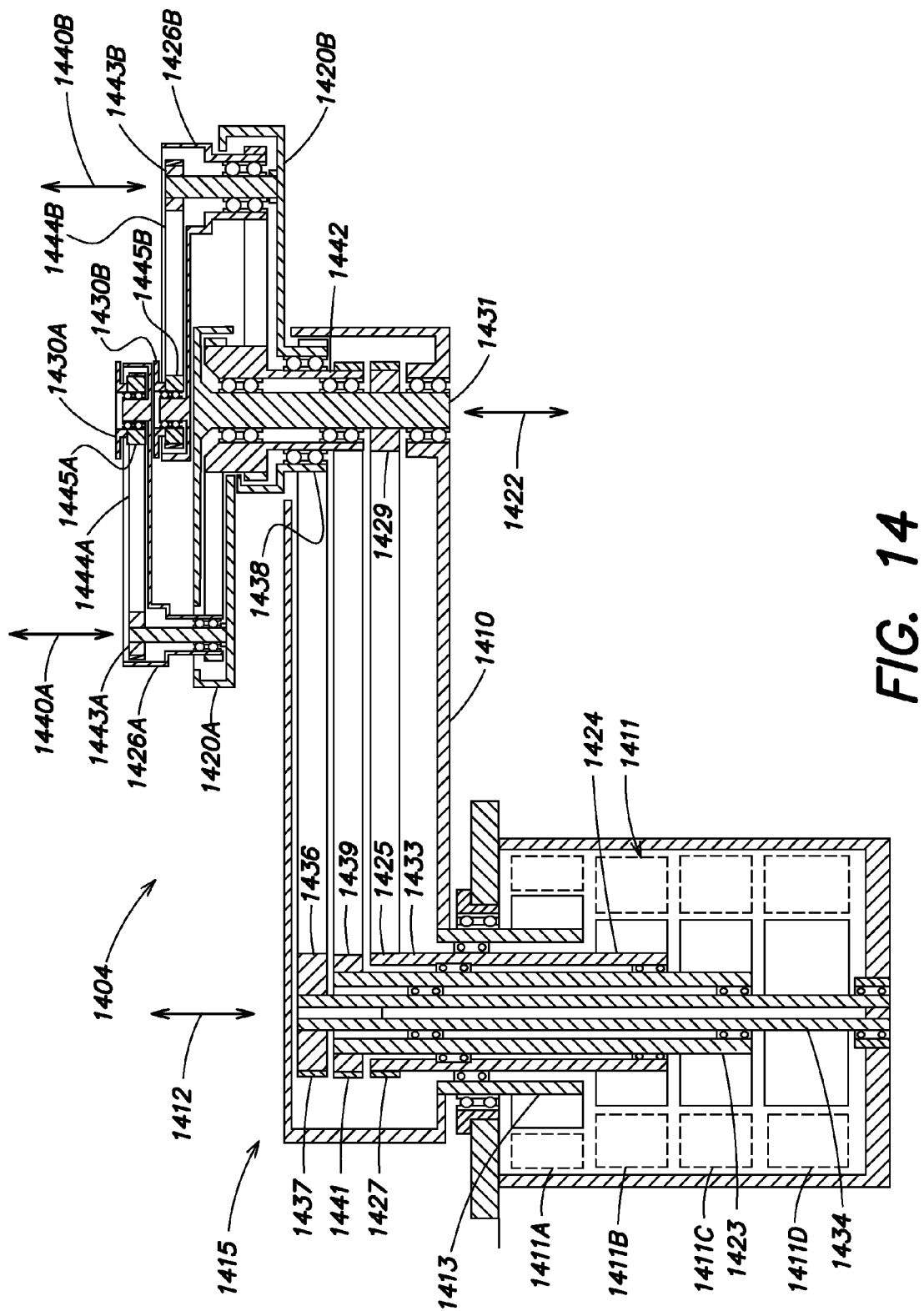
FIG. 14 is a partially cross-sectioned side view of a robot apparatus illustrating another possible drive system adapted to drive a dual arm robot according to embodiments of the present invention.

FIG. 14 illustrates an exemplary drive system 1415 adapted to drive the various components of the robot apparatus 1404. This type of drive system 1415 may be used with the embodiments described with reference to FIGS. 3A-3C, 6A-6B, and 7A-7B, for example. In comparison with the drive system of FIG. 12, an additional drive component and additional motor component are added. First, the drive system 1415 may include drive components adapted to rotate a boom linkage 1410 about the rotational axis 1412. A pilot 1413 may extend from the boom linkage 1410 and may be supported by suitable bearings wherein the pilot 1413 is adapted to be rotated by a component motor 1411A of a motive power member 1411 about the rotational axis 1412. The motor component 1411A may be an electrical motor including a rotor and stator, for example. However, any suitable motor may be used.

Furthermore, the drive system 1415 may include drive components adapted to rotate a first upper arm 1420A about the shoulder axis 1422. The drive components may include a drive shaft 1433 coupled to a drive pulley 1425, a metal belt 1427, and a driven pulley 1429 coupled to the first upper arm 1420A by a second pilot 1431. Rotation of a motor component 1411B causes rotation of the shaft 1433 and drive pulley 1425 and drives the driven pulley 1429 thereby rotating the pilot 1431 and attached first upper arm 1420A about the shoulder axis 1422. The motor component 1411B may be an electrical motor including a rotor and stator, for example. However, any suitable motor may be used.

Similar to the first upper arm 1420A, the drive system 1415 may include drive components adapted to rotate a second upper arm 1420B about the shoulder axis 1422. The drive components may include a drive shaft 1434 coupled to a drive pulley 1436, a metal belt 1437, and a driven pulley 1438 coupled to the second upper arm 1420B. Rotation of a motor component 1411D causes rotation of the shaft 1434 and drive pulley 1436 and drives the driven pulley 1438 thereby rotating the second upper arm 1420B about the shoulder axis 1422. The motor component 1411D may be an electrical motor including a rotor and stator, for example. However, any suitable motor may be used.

Additionally, the drive system 1415 may include drive components adapted to rotate the first forearm 1426A and second forearm 1426B about the elbow axes 1440A, 1440B, respectively. The drive components may include a drive shaft 1224 coupled to a drive pulley 1239, a metal belt 1241, and a driven pulley 1442 coupled to the first forearm 1426A and the second forearm 1426B. Activation of the motor component 1411C may cause the forearms 1420A, 1420B to rotate in opposite directions relative to one another.

The wrist members 1230A, 1430B may be coupled to the first and second upper arms 1420A, 1420B, respectively, by drive pulleys 1443A, 1443B, metal belts 1444A, 1444B and driven pulleys 1445A, 1445B. Thus, the wrist members 1430A, 1430B are positioned one above another (such as shown in FIG. 3A-3C, and activation of the motor component 1411C causes rotation of the drive shaft 1423 and drive pulley 1439 and drives the driven pulley 1442 thereby rotating the forearms 1426A, 1426B. Accordingly, the wrist members 1430A, 1430B move in opposite directions in a translational mode into and out the plane of cross section shown. The motor component 1411C may also be an electrical motor including a rotor and stator, for example. However, any suitable motor may be used. Suitable conventional rotational encoders (not shown) may be used to position the boom 1410 and upper arms 1420A, 1420B and forearms 1426A, 1426B as desired.

Any of the aforementioned assemblies may include additional capability of controlling yaw of the wrist members. U.S. Provisional Patent Application No. 61/143,808 which was co-filed as PCT Patent Application No. PCT/US2010/

20477 with the present application and entitled "SYSTEMS, APPARATUS AND METHODS FOR TRANSPORTING SUBSTRATES IN ELECTRONIC DEVICE MANUFACTURING," describes drive systems adapted to provide independent rotation of a wrist member of a robot.

As should be apparent, this drive system 1415 may be used in the robot apparatus of FIGS. 3A-3C, but may be modified to drive the assemblies of the embodiment of FIGS. 6A and 6B and 7A and 7B, via generating an exact mirror duplicate of the components described above and extending them to the left of the centerline 1412. These mirrored components would couple the respective belts thereof to pulleys identical to the pulleys 1425, 1439, and 1436, which may be arranged adjacent to or part of these pulleys. In this way, a single motor component such as 1411D may cause the rotation of upper arm 1420B and a corresponding upper arm (in the opposite direction) attached to the boom extension on the other end of the boom (e.g., 610, 710). Similarly, motor component 1411B may cause the rotation of upper arm 1420A and rotation (in the opposite direction) of a corresponding upper arm attached to the boom 710A on the other end of the boom. Furthermore, rotation of a single motor component such as 1411C may cause the rotation of forearms 1426A, 1426B and corresponding forearms attached to the boom extension on the other end of the boom (e.g., 610, 710).

The foregoing description discloses only exemplary embodiments of the invention. Modifications of the above-disclosed apparatus and methods which fall within the scope of the invention will be readily apparent to those of ordinary skill in the art.

Accordingly, while the present invention has been disclosed in connection with exemplary embodiments thereof, it should be understood that other embodiments may fall within the spirit and scope of the invention, as defined by the following claims.

The invention claimed is:

1. An electronic device processing system, comprising:
   a chamber;
   a robot apparatus received in the chamber and adapted to transport at least one substrate, the robot apparatus having a rigid cantilever boom linkage adapted to rotate about a rotational axis of the boom linkage and a first robot assembly and a second robot assembly,
   the boom linkage comprises:
      first and second cantilever beams extending in two directions from the rotational axis of the boom linkage;
      the first robot assembly being mounted to the first cantilever beam, and the second robot assembly being mounted to the second cantilever beam, wherein a line extending between a shoulder axis of the first robot assembly and a shoulder axis of the second robot assembly is offset from the rotational axis of the boom linkage,
   the first robot assembly further including:
      upper arms coupled to the boom linkage at a first radial position offset from a rotational axis of the boom linkage and adapted to be rotated in an X-Y plane relative to the boom linkage about a shoulder axis,
      forearms coupled to, and adapted for rotation relative to, the respective upper arms at respective elbow axes spaced from the shoulder axis,
      wrist members coupled to, and the respective forearms, adapted for rotation in an X-Y plane relative to the respective forearms at wrist axes spaced from the elbow axes to cause motion of the respective wrist members in opposing directions in a translational mode, and
      at least one end effector included on each wrist member of the respective wrist members, the at least one end effector adapted to carry the at least one substrate, wherein each wrist axis for each wrist member is positioned offset from the rotational axis of the boom linkage;
   and the robot apparatus being attached to a drive system with motor components located outside of the chamber;
   the drive assembly including
      drive components adapted to rotate the boom linkage about the rotational axis of the boom linkage including a first motor component;
      drive components adapted to rotate the respective upper arms of the first robot assembly about the shoulder axis, each respective drive component including a drive shaft coupled to a drive pulley, a belt, and a driven pulley coupled to the respective upper arms by respective pilots and respective motor components, the drive components are configured such that rotation of the respective motor components causes rotation of the respective drive shaft and respective drive pulley and drives the respective driven pulley thereby rotating the respective pilots and the respective upper arms about the shoulder axis; and
      drive components adapted to rotate the respective forearms about the respective elbow axes, including a second drive shaft coupled to a second drive pulley, a second belt, and a second driven pulley coupled to the respective forearms and the respective wrist members by a third shaft, configured such that rotation of a third motor component causes rotation of the second drive shaft and the second drive pulley and drives the second driven pulley thereby rotating the third shaft, which rotates the forearms about the respective elbow axis and the wrist members about the respective wrist axes such that the wrist members are capable of motion in opposing directions in the translational mode.

2. The system of claim 1 wherein the first and second cantilever beams are substantially rigid.

3. The system of claim 1 wherein the second robot assembly comprises:
   upper arms coupled to the boom linkage at a second radial position offset from a rotational axis of the boom linkage,
   forearms coupled to and adapted for rotation relative to the respective upper arm,
   wrist members coupled to and adapted for rotation relative to the respective forearms, and
   at least one end effector included on each wrist member of the wrist members, the at least one end effector adapted to carry the at least one substrate.

4. The system of claim 1 wherein the first robot apparatus comprises two end effectors.

5. The system of claim 1 wherein the chamber is a transfer chamber having at least one process chamber and at least one load lock chamber coupled thereto.

6. The system of claim 1 the second robot assembly includes two end effectors.

7. A robot apparatus adapted to move substrates within an electronic device processing system and a drive system for the robot apparatus, comprising:
   a rigid cantilever boom linkage adapted to be rotated about a rotational axis of the boom linkage;
   the boom linkage comprises
      first and second cantilever beams extending in two directions from the rotational axis and wherein the first robot assembly is mounted to the first cantilever beam, and a second robot assembly is mounted to the second cantilever beam, wherein a line extending between a shoulder axis of the first robot assembly and a shoulder axis of the second robot assembly is offset from the rotational axis of the boom linkage, each of the first robot assembly and the second robot assembly further comprising:

upper arms mounted for rotation on the boom linkage at a position offset radially from the rotational axis of the boom linkage and adapted to be rotated in an X-Y plane relative to the boom linkage about a shoulder axis;

a forearm coupled to an outboard end of each of the respective upper arms at elbow axes spaced from the shoulder axis;

a wrist members coupled to an outboard end of each of the forearms and adapted for rotation in an X-Y plane relative to the forearms at a wrist axes, spaced from the respective elbow axes, wherein the wrist axis for each wrist member is positioned offset rotational axis of the boom linkage; and at least one end effector included on each wrist member, wherein the wrist axis for each wrist member is positioned offset from the rotational axis of the boom linkage;

and the robot apparatus being attached to a drive system with motor components located outside of a chamber in which the robot apparatus is received; the drive assembly including drive components adapted to rotate the boom linkage about the rotational axis of the boom linkage including a motor component;

drive components adapted to rotate the upper arms about the shoulder axis, each respective drive component including a drive shaft coupled to a drive pulley, a belt, a driven pulley coupled to the respective upper arm by a respective pilot and a respective motor components, wherein rotation of the respective motor component causes rotation of the respective drive shaft and respective drive pulley and drives the respective driven pulley thereby rotating the respective pilot and the respective upper arm about the shoulder axis; and drive components adapted to rotate the respective forearms about the elbow axes, including a second drive shaft coupled to a second drive pulley, a second belt, and a second driven pulley coupled to the respective forearms and the wrist members, wherein rotation of a third motor component causes rotation of the respective forearms about the elbow axes and the wrist members about wrist axes, the wrist members configured such that they are capable of motion in opposite directions in a translational mode.

8. A method of transporting at least one substrate within an electronic device processing system, comprising:

providing a first robot assembly mounted on a boom linkage, the boom linkage comprising first and second rigid cantilever beams extending in two directions from the boom linkage rotational axis and wherein the first robot assembly is mounted to the first cantilever beam, and a second robot assembly is mounted to the second cantilever beam, wherein a line extending between a shoulder axis of the first robot assembly and a shoulder axis of the second robot assembly is offset from the rotational axis of the boom linkage, the first robot assembly and the second robot assembly each include upper arms, a forearm coupled to each of the upper arms, and a wrist members coupled to the forearms, the robot apparatus being attached to a drive assembly with motor components located of a chamber in which the robot apparatus is received; the drive assembly including drive components adapted to rotate the boom linkage about the rotational axis of the boom linkage including a motor component;

drive components adapted to rotate the respective upper arms about the shoulder axis, each drive component including a drive shaft coupled to a drive pulley, a belt, a driven pulley coupled to the respective upper arm by a respective pilot and a respective motor component, wherein rotation of the motor component causes rotation of the respective drive shaft and respective drive pulley and drives the respective driven pulley thereby rotating the respective pilot and the respective upper arm about the shoulder axis; and drive components adapted to rotate each of the forearm about the elbow axes, including a second drive shaft coupled to a second drive pulley, a second belt, and a second driven pulley coupled to the respective forearms and the wrist members, wherein rotation of a third motor component causes rotation of the second drive shaft and the second drive pulley and drives the second driven pulley thereby rotating, the respective forearms about the elbow axes and the wrist members about wrist axes, the tw wrist members being configured to move in opposite directions in a translational mode, the wrist axis spaced from the elbow axis, and the wrist axes for each wrist member are positioned offset from the rotational axis of the boom linkage;

rotating the boom linkage to a location adjacent to a delivery location; and actuating the first robot assembly and the second robot assembly to perform at least one of a put of at least one substrate to the delivery location, and a pick of at least one substrate from the delivery location.

9. The method of claim 8 wherein the step of actuating the robot assembly comprises rotating at least the upper arm, and the forearm of the first robot assembly and the second robot assembly.

10. An electronic device processing system, comprising:
a chamber;
a robot apparatus received in the chamber and adapted to transport at least one substrate, the robot apparatus having a boom linkage including a first rigid cantilever beam and a second rigid cantilever beam extending outwardly in opposite radial directions from a rotational axis of the boom linkage, the boom linkage having a boomerang shape and being adapted to rotate about the rotational axis of the boom linkage, the boom linkage including a first dual robot assembly and a second dual robot assembly, each of the dual robot assemblies including dual sets of arms mounted on the boom linkage at respective outboard ends of the boom linkage spaced a distance from the rotational axis of the boom linkage, wherein the two robot assemblies are mounted on the boom linkage at two different outboard ends of the boom linkage, wherein a line extending between a shoulder axis of the first dual robot assembly and a shoulder axis of the second dual robot assembly is offset from the rotational axis of the boom linkage, each of the dual set of arms including:
two upper arms each adapted to rotate about a shoulder axis, two forearms coupled to the upper arms at their respective elbow axes and adapted for rotation about the respective elbow axes in an X-Y plane, each forearm including a wrist axis at its outboard end at which a wrist member is coupled, each wrist member is adapted for rotation about its wrist axis in the X-Y plane, such that the two wrist members move in opposite directions in a translational mode, the wrist axis being spaced from the elbow axis, and the wrist axis for each wrist member being positioned offset from the rotational axis of the boom linkage, and at least one end effector included on each wrist member of the two wrist members, each end effector adapted to carry the at least one substrate.

11. An electronic device processing system, comprising:

a robot apparatus received in the chamber and adapted to transport at least one substrate, the robot apparatus having a boom linkage including a first rigid cantilever beam and a second rigid cantilever beam each extending outwardly in opposite radial directions from a rotational axis of the boom linkage, the boom linkage being adapted to rotate about the rotational axis of the boom linkage, the boom linkage including a first dual robot assembly and a second dual robot assembly, each of the dual robot assemblies including dual set of arms mounted on the boom linkage at respective outboard ends of the boom linkage spaced a distance from the rotational axis of the boom linkage, wherein a line extending between a shoulder axis of the first dual robot assembly and a shoulder axis of the second dual robot assembly is offset from the rotational axis of the boom linkage, each of the dual set of arms including:

two upper arms each adapted to rotate about a shoulder axis, two forearms coupled to the upper arms at respective elbow axes and adapted for rotation about the respective elbow axes in an X-Y plane, each forearm including a wrist axis at its outboard end at which a wrist is coupled, each wrist member is adapted for rotation about its wrist axis in the X-Y plane, such that the two wrist members are configured for motion in opposite directions in a translational mode, the wrist axes for each wrist member being positioned offset from the rotational axis of the boom linkage; and at least one end effector included on each wrist member of the two wrist members, the at least one end effector adapted to carry the at least one substrate.

* * * * *